(12) United States Patent
Nemoto

(10) Patent No.: US 7,148,576 B2
(45) Date of Patent: Dec. 12, 2006

(54) SEMICONDUCTOR DEVICE AND METHOD OF FABRICATING THE SAME

(75) Inventor: Yoshihiko Nemoto, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/150,296

(22) Filed: Jun. 13, 2005

(65) Prior Publication Data

US 2005/0224949 A1    Oct. 13, 2005

Related U.S. Application Data

(62) Division of application No. 10/252,504, filed on Sep. 24, 2002, now abandoned.

(30) Foreign Application Priority Data

Sep. 28, 2001 (JP) ............................. 2001-299756
Apr. 5, 2002 (JP) ............................. 2002-103684

(51) Int. Cl.
  *H01L 23/48* (2006.01)
  *H01L 23/52* (2006.01)
  *H01L 29/40* (2006.01)
(52) U.S. Cl. ...................... 257/781; 257/780; 257/784; 257/738; 257/737; 257/693; 257/E23.021; 257/E23.069
(58) Field of Classification Search ................ 257/690, 257/692, 693, 737, 734, 780, 781, 685, 686, 257/738, 778, 779, 784, E23.021
See application file for complete search history.

(56) References Cited

U.S. PATENT DOCUMENTS

| 4,635,165 | A | * | 1/1987 | Okuaki ....................... 361/684 |
| 5,122,860 | A | | 6/1992 | Kikuchi et al. |
| 6,072,239 | A | | 6/2000 | Yoneda et al. |
| 6,247,229 | B1 | * | 6/2001 | Glenn .......................... 29/841 |
| 6,258,632 | B1 | | 7/2001 | Takebe |
| 6,451,624 | B1 | * | 9/2002 | Farnworth et al. .......... 438/106 |
| 6,489,676 | B1 | * | 12/2002 | Taniguchi et al. .......... 257/698 |
| 6,541,848 | B1 | | 4/2003 | Kawahara et al. |
| 6,624,008 | B1 | | 9/2003 | Hasegawa |
| 6,740,964 | B1 | * | 5/2004 | Sasaki ......................... 257/687 |
| 7,009,300 | B1 | * | 3/2006 | Gacusan ...................... 257/777 |

FOREIGN PATENT DOCUMENTS

| JP | 9-162348 | 6/1997 |
| JP | 10-98133 | 4/1998 |

* cited by examiner

*Primary Examiner*—Evan Pert
*Assistant Examiner*—Victor A. Mandala, Jr.
(74) *Attorney, Agent, or Firm*—McDermott Will & Emery LLP

(57) ABSTRACT

A semiconductor device having a structure miniaturizable through simple fabrication steps and a method of fabricating a semiconductor device capable of remarkably improving production efficiency are obtained. The semiconductor device comprises a semiconductor chip including a semiconductor circuit having a prescribed function and an electrode on one main surface, a wire having a first end connected with the electrode and a second end having a connecting terminal connected to an external device and an insulator sealing at least the main surface of the semiconductor chip. The connecting terminal provided on the second end of the wire is a part formed while keeping a state integrated with the remaining part of the wire, and exposed on a bottom surface opposite to the upper surface of the insulator closer to the main surface.

2 Claims, 42 Drawing Sheets

SEMICONDUCTOR DEVICE AND METHOD OF FABRICATING THE SAME

RELATED APPLICATION

This application is a divisional of application Ser. No. 10/252,504 filed on Sep. 24, 2002 now abandoned.

BACKGROUND OF THE INVENTION

1. Field of the Invention

The present invention relates to a semiconductor device and a method of fabricating the same, and more particularly, it relates to a miniaturized semiconductor device capable of remarkably improving production efficiency and a method of fabricating the same.

2. Description of the Prior Art

FIG. 95 is a sectional block diagram showing an exemplary conventional semiconductor device. A semiconductor chip 101a formed on a wafer is mounted on a die pad 105b of a lead frame. Electrode pads 103 of the semiconductor chip 101a are connected with external leads 105a serving as external connecting terminals by wires 102. The wires 102 form wire connecting terminals 102b on portions con connected with the electrode pads 103, while forming wire connecting terminals 102a on portions connected with the external leads 105a. Portions excluding external terminals of the external leads 105a are sealed with insulating resin 104, as shown in FIG. 95.

FIGS. 96 to 100 show a method of fabricating the aforementioned semiconductor device. As shown in FIG. 96, a plurality of semiconductor circuit areas (semiconductor chip regions) 101a are arranged and formed on the wafer 101, for providing the electrode pads 103 on the surface of each semiconductor chip 101a. As shown in FIG. 97, the wafer 101 is cut in units of the semiconductor chip regions 101a, for obtaining each fragmented semiconductor chip 101a. Thereafter the fragmented semiconductor chip 101a is fixed to the die pad 105b of the lead frame, as shown in FIG. 98. Then, the electrode pads 103 arranged on the upper surface of the semiconductor chip 101a and the external leads 105 a are connected with each other by the wires 102, as shown in FIG. 99. Thereafter the portions excluding the terminals of the external leads 105a are sealed with the resin 104, as shown in FIG. 100. Finally, portions of the external leads 105a exposed from the sealing resin 104 are bent inward for reducing the size, thereby fabricating the semiconductor device shown in FIG. 95.

A semiconductor device such as a DRAM (dynamic random access memory), for example, having excellent reliability can be obtained by the aforementioned fabrication method.

However, the aforementioned semiconductor device employs the lead frame, and hence the external leads 105a are inevitably located outside the semiconductor chip 101a in a planar view. In order to eliminate such a factor inhibiting the semiconductor device from miniaturization, some proposals have heretofore been made. For example, FIG. 101 shows a structure proposed in Japanese Patent Laying-Open No. 9-162348 (1997). Referring to FIG. 101, resin projections 104a covered with metal films 115a are provided on the bottom of a semiconductor chip 101a for connecting the metal films 115a with electrode pads 103 of the semiconductor chip 101a with wires 102. According to this structure, no terminals for external connection are provided outside sealing resin, and hence this semiconductor device can be miniaturized.

FIG. 102 shows another structure proposed in Japanese Patent Laying-Open No. 10-98133 (1998). Referring to FIG. 102, external connection means 125a is arranged in proximity to a semiconductor chip 101a without employing a lead frame. In this semiconductor device, the semiconductor chip 101a and the external connection means 125a are sealed with resin 104 and exposed on the back surface. This semiconductor device can also be miniaturized due to the external connection means 125a located inside the sealing resin 104 in a planar view.

However, the structure according to Japanese Patent Laying-Open No. 9-162348 shown in FIG. 101 requires pattern formation for the metal films 115a covering the resin projections 104a. Therefore, the number of fabrication steps is complicatedly increased. Thus, the fabrication cost is increased, and the yield may be reduced.

In the structure according to Japanese Patent Laying-Open No. 10-98133 shown in FIG. 102, an additional member, i.e., the external connection means 125a must be arranged during fabrication steps. Therefore, the fabrication steps are complicated to increase the fabrication cost, and the yield may be reduced.

In addition, each of the aforementioned semiconductor devices is generally fabricated by cutting a wafer provided with semiconductor chips through prescribed processing steps along sections of the wafer for obtaining fragmented individual semiconductor chips. According to a general fabrication method, each of the semiconductor devices shown in FIGS. 96 to 100 is fabricated through a step of fragmenting the semiconductor chip in advance of a step of sealing portions of the wafer with resin.

When electrode pads of the semiconductor chip and connecting terminals are wire-bonded and sealed with resin through the step of fragmenting the semiconductor chip, alignment etc. must be performed in each fragmented semiconductor chip, leading to limitation of the production efficiency. While the price of a semiconductor device is reduced by mass production for facilitating popularization of the semiconductor device, the aforementioned system fabricating a semiconductor package for each fragmented semiconductor chip is problematic in view of mass productivity.

In the aforementioned method fabricating the semiconductor package for each fragmented semiconductor device, it is difficult to handle the semiconductor device when the same is miniaturized. It is obviously difficult to handle the aforementioned semiconductor device shown in FIG. 101 or 102 when the same is miniaturized.

Further, complicated processing steps are required for fabricating a semiconductor device such as the aforementioned miniaturized semiconductor device shown in FIG. 101 or 102 by stacking a plurality of individual fragmented semiconductor chips, and the finished semiconductor device is also complicated in structure. FIG. 103 shows a multilayer structure employing a lead frame. Referring to FIG. 103, the sizes of stacked semiconductor chips 101a must be gradually reduced in ascending order, and hence the number of stackable layers of the semiconductor chips 101a is limited. FIG. 104 shows a multilayer structure formed by stacking semiconductor chips 101a of the same size. It is understood from FIG. 104 that the semiconductor chips 101a of the same size must be stacked through a spacer 111. When the spacer 111 is employed, not only the structure is complicated but also a connecting step is required for each layer. Therefore, fabrication efficiency is disadvantageously reduced.

SUMMARY OF THE INVENTION

An object of the present invention is to provide a miniaturized semiconductor device capable of remarkably improving production efficiency and a method of fabricating this semiconductor device.

The semiconductor device according to the present invention comprises a semiconductor chip including a semiconductor circuit having a prescribed function and an electrode on a main surface, a metal wire having a first end connected with the electrode and a second end having a connecting terminal connected with an external device and an insulator covering at least the main surface of the semiconductor chip. In this semiconductor device, the connecting terminal provided on the second end of the metal wire is a part formed while keeping a state integrated with the remaining part of the metal wire, and exposed on a bottom surface opposite to the upper surface of the insulator.

According to the aforementioned structure, the connecting terminal integrally formed with the metal wire is exposed from the bottom. When the semiconductor device is fabricated, therefore, the part of the connecting terminal continuous with the metal wire connects the aforementioned electrode, a tentative conductive or support plate, for example, and the connecting terminal integrally formed with the metal wire with each other. The aforementioned connecting terminal and the terminal part provided on the electrode are integrally formed with the metal wire. The connecting terminal and the terminal part provided on the electrode may be formed in a step of arranging the metal wire while keeping the state integrated with the remaining part of the metal wire. At this time, the part for defining the connecting terminal may be deformed by working. Therefore, (1) no seam is present between the connecting terminal and the remaining part of the metal wire, and (2) the connecting terminal and the remaining part of the metal wire are substantially identical in composition to each other. The connecting terminal and the terminal part provided on the electrode may allowedly be different in shape from the metal wire. When the metal wire is prepared from a wire, for example, the connecting terminal is brought into the form of a ball bond or a stitch bond by working the wire in a wire connection step. When the metal wire is formed by gas deposition or plating, the connecting terminal can be brought into an arbitrary form suitable for serving as a connecting part. The aforementioned tentative conductive or support plate can be removed in a later step.

When forming the metal wire by a wire, for example, the following working can be performed in a wire bonding step:

(a) The forward end of the wire is connected to the electrode of the aforementioned semiconductor chip, for forming a first pressure contact part. Then, a second pressure contact part is similarly formed also on the aforementioned tentative conductive plate, so that the wire continuous to a supply source in a bonding tool can be cut. When the second pressure contact part is formed on the tentative conductive plate, the wire is crushed to be increased in width. Therefore, the wire can be employed as the connecting terminal. Wire bonding conditions can be adjusted for increasing the width of the wire beyond those of the pressure contact parts formed under general pressure contact conditions. In ultrasonic wire bonding of an aluminum wire, further, similar pressure contact parts are formed on both of aluminum wire connecting portions of the electrode provided on the semiconductor chip and the support plate respectively. Also in this case, the pressure contact parts of the aluminum wire, merely connected onto the tentative conductive plate, are increased in width. Therefore, the aluminum wire can be readily employed as the connecting terminal. Further, the pressure contact parts can be worked in a larger width than those of general pressure contact parts by adjusting conditions for the ultrasonic wire bonding.

(b) It is also possible to melt the forward end portion of the wire for forming a bulk part and forming a ball bond on the tentative conductive plate and thereafter form a stitch bond on the electrode of the semiconductor chip.

(c) It is also possible to melt the forward end portion of the wire for forming a bulk part and forming a ball bond on the electrode of the semiconductor chip and thereafter form a stitch bond on the tentative conductive plate.

Through any of the steps (a), (b) and (c), the connecting terminal can be formed by the end of the metal wire worked and connected to the conductive plate by removing the tentative conductive plate in a later step.

Consequently, a semiconductor device miniaturized by employing no lead frame can be fabricated through extremely simple fabrication steps. As a result, a miniaturized semiconductor device having high reliability can be obtained at a low cost.

A method of fabricating semiconductor devices according to the present invention is a method of fabricating at least two semiconductor devices from a semiconductor substrate including at least two semiconductor circuit areas provided with electrodes having prescribed functions for attaining electrical connection with an external device arranged on a first main surface. This fabrication method comprises steps of bonding a support plate to a second main surface of the semiconductor substrate opposite to the first main surface, forming a trench for separating at least two semiconductor circuit areas into individual semiconductor circuit areas to expose the support plate around the semiconductor circuit areas, connecting the electrodes and the support plate exposed in the trench with each other by a metal wire, and removing the support plate.

According to this method, semiconductor chips (the semiconductor circuit areas) are not fragmented but connected to the support plate on the bottom of the trench in the state supported by the support plate in the step of connecting the electrodes and the support plate with each other by the metal wire. When the aforementioned connecting step is carried out through wire bonding, for example, the electrodes of the semiconductor chips and connecting terminals are wire-bonded to each other. Therefore, no alignment may be performed every conductor element but production efficiency can be remarkably improved. Thus, the fabrication method is remarkably excellent in view of mass productivity.

The fabrication method is also excellent in handleability coming into question when performing miniaturization in a method of fabricating a semiconductor package every fragmented semiconductor device.

Further, a semiconductor device having a multilayer structure can be obtained by stacking semiconductor devices of the same size with no requirement for a complicated processing step. In addition, neither a spacer nor a specific circuit board may be employed at this time. Thus, the semiconductor device having a multilayer structure can be obtained without limiting the number of the stacked layers.

A method of fabricating semiconductor devices according to another aspect of the present invention is a method of fabricating at least two semiconductor devices from a semiconductor substrate having at least two semiconductor circuit areas provided with electrodes having prescribed functions for attaining electrical connection with an external device arranged on a first main surface. This method of fabricating semiconductor devices comprises steps of cutting the semiconductor substrate into individual semiconductor circuit areas, bonding a support plate to a second main surface of the semiconductor substrate opposite to the first main surface, connecting the electrodes with the support plate exposed in a trench by a metal wire, and removing the support plate.

According to this method, electrodes of fragmented semiconductor chips and the support plate can be connected with each other by the metal wire. Therefore, the semiconductor devices can generally be fabricated by employing a conventional fabrication line as such.

The foregoing and other objects, features, aspects and advantages of the present invention will become more apparent from the following detailed description of the present invention when taken in conjunction with the accompanying drawings.

Figure 33:
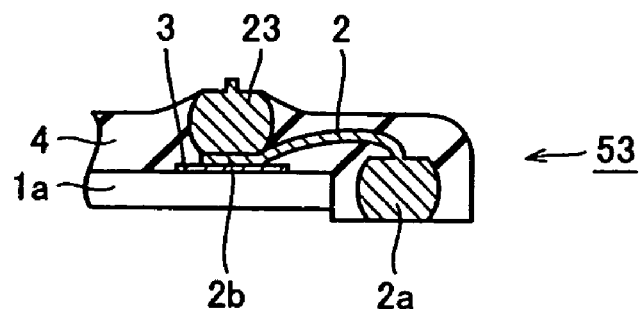
FIG. 33 illustrates a semiconductor device fragmented by removing resin from an intersection between trenches shown in FIG. 32.
Figure 35:
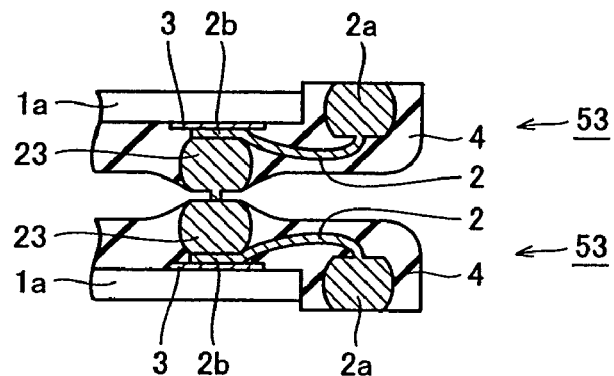
Figure 36:
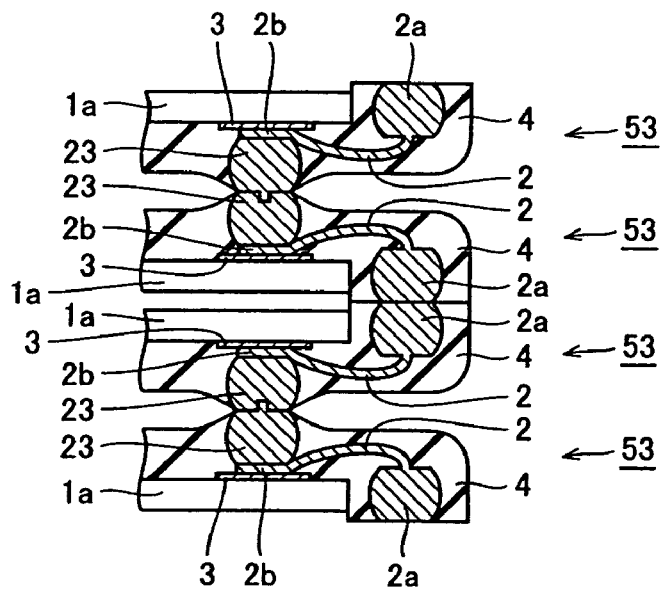
Figure 37:
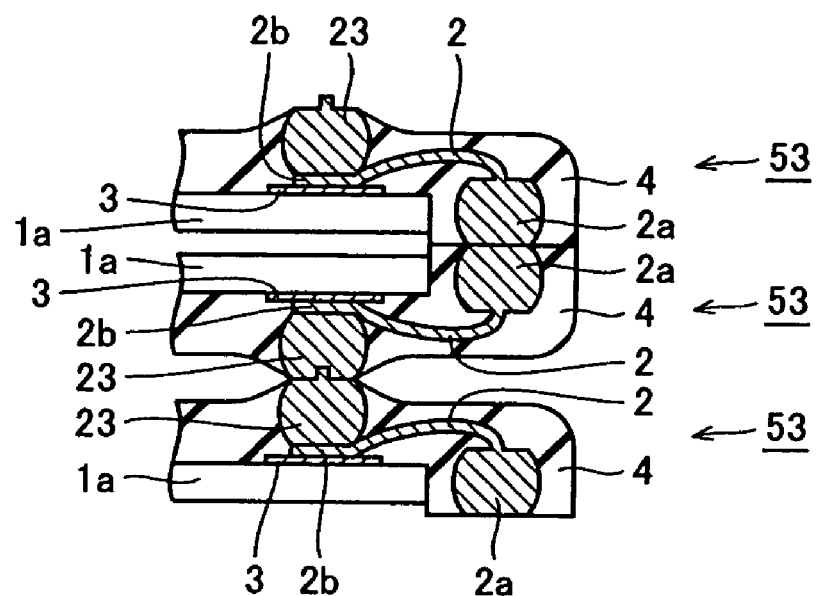
Figure 38:
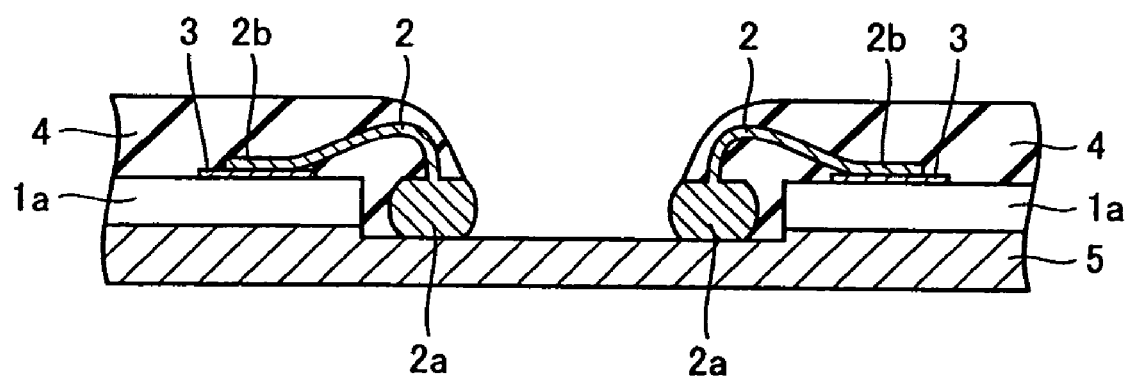
Figure 39:
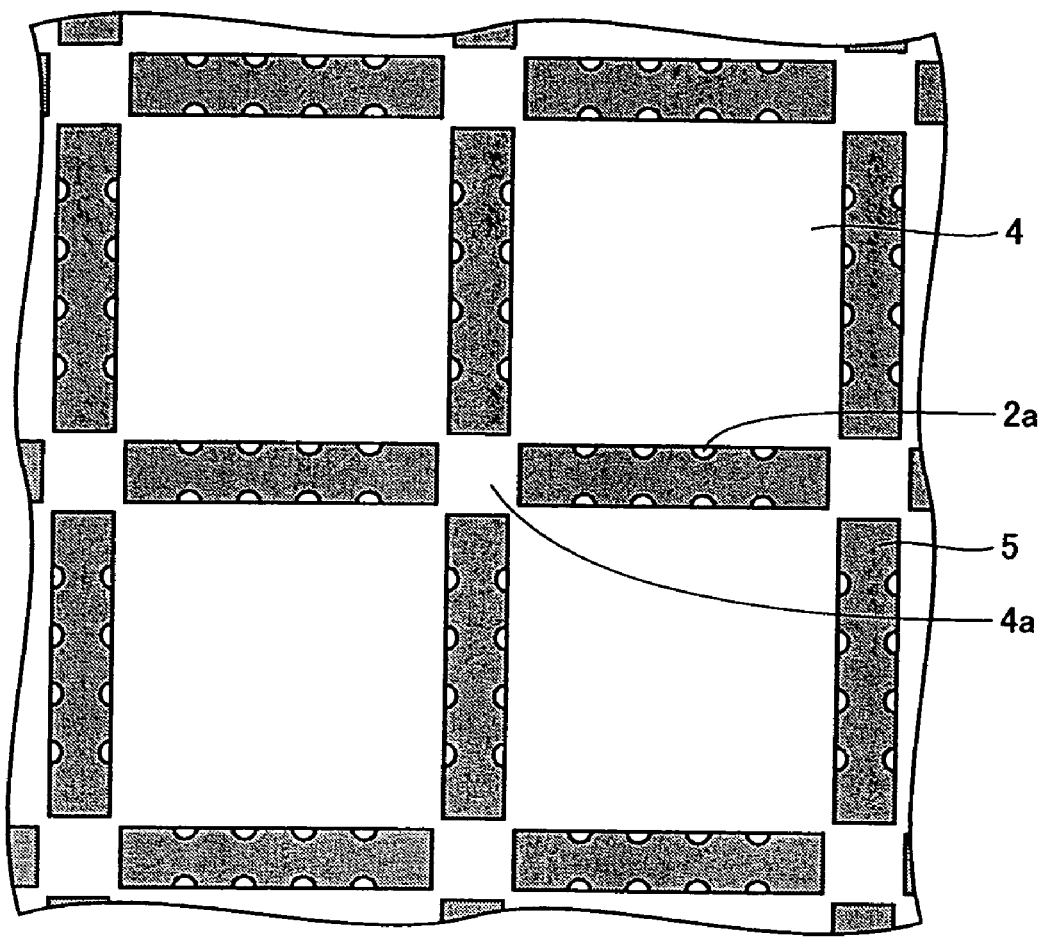
Figure 40:
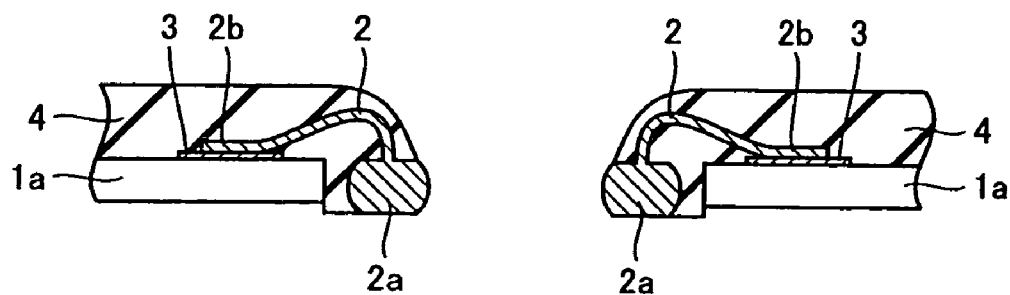
Figure 41:
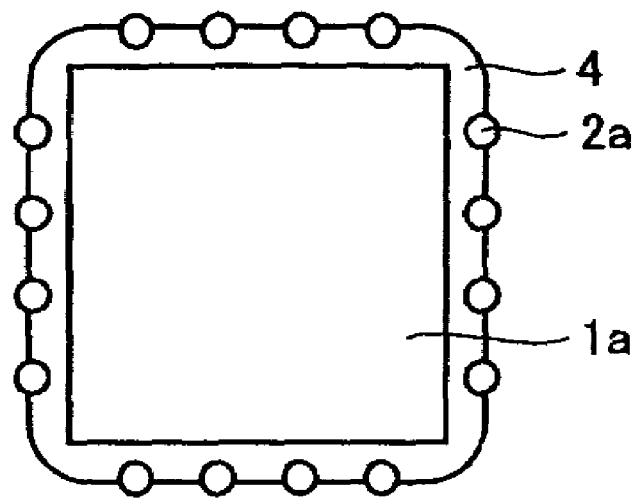
Figure 42:
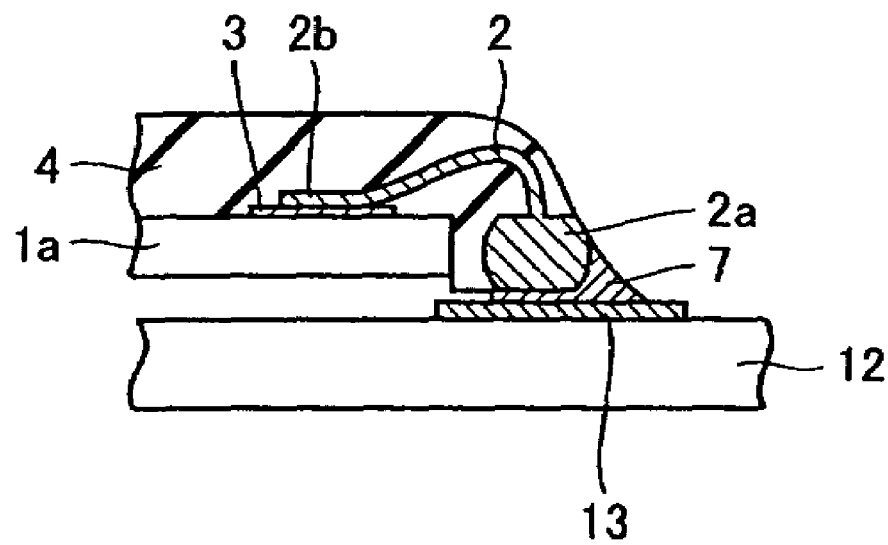
Figure 43:
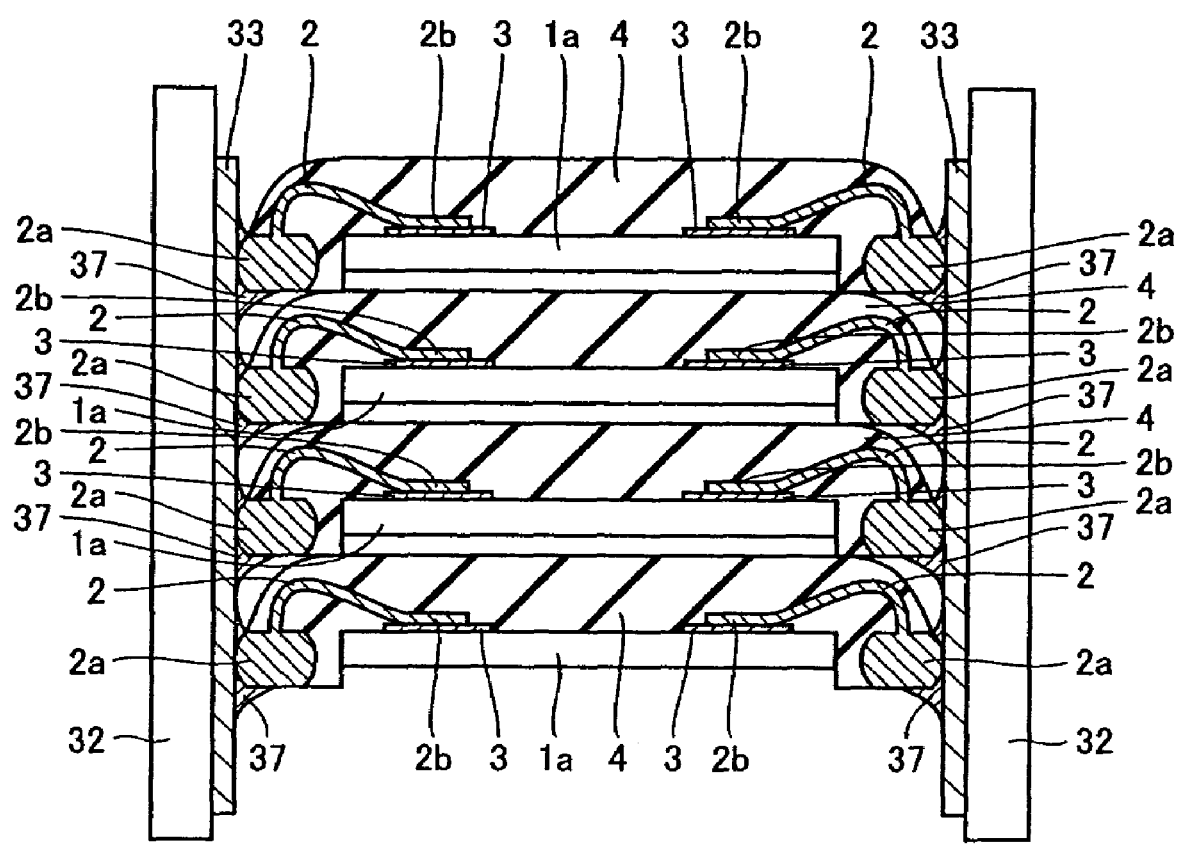
Figure 44:
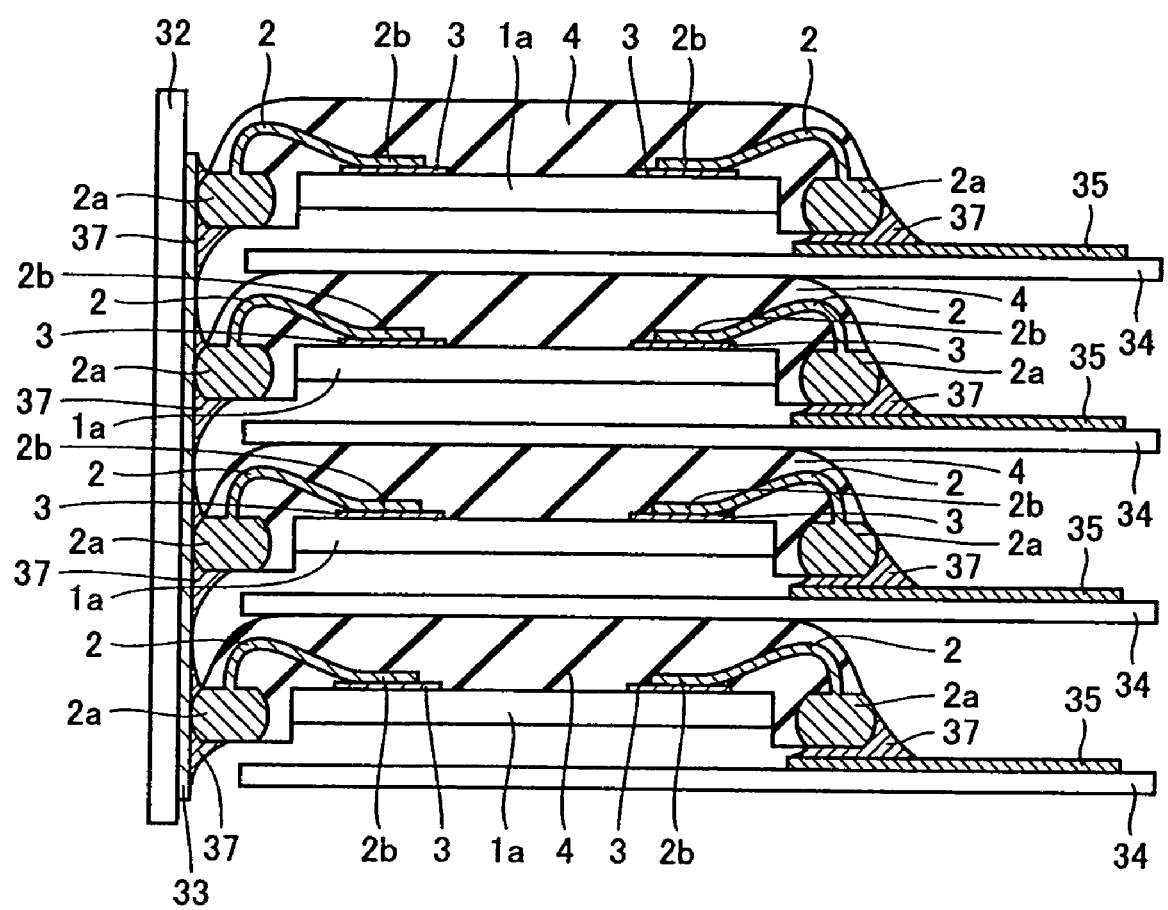
Figure 45:
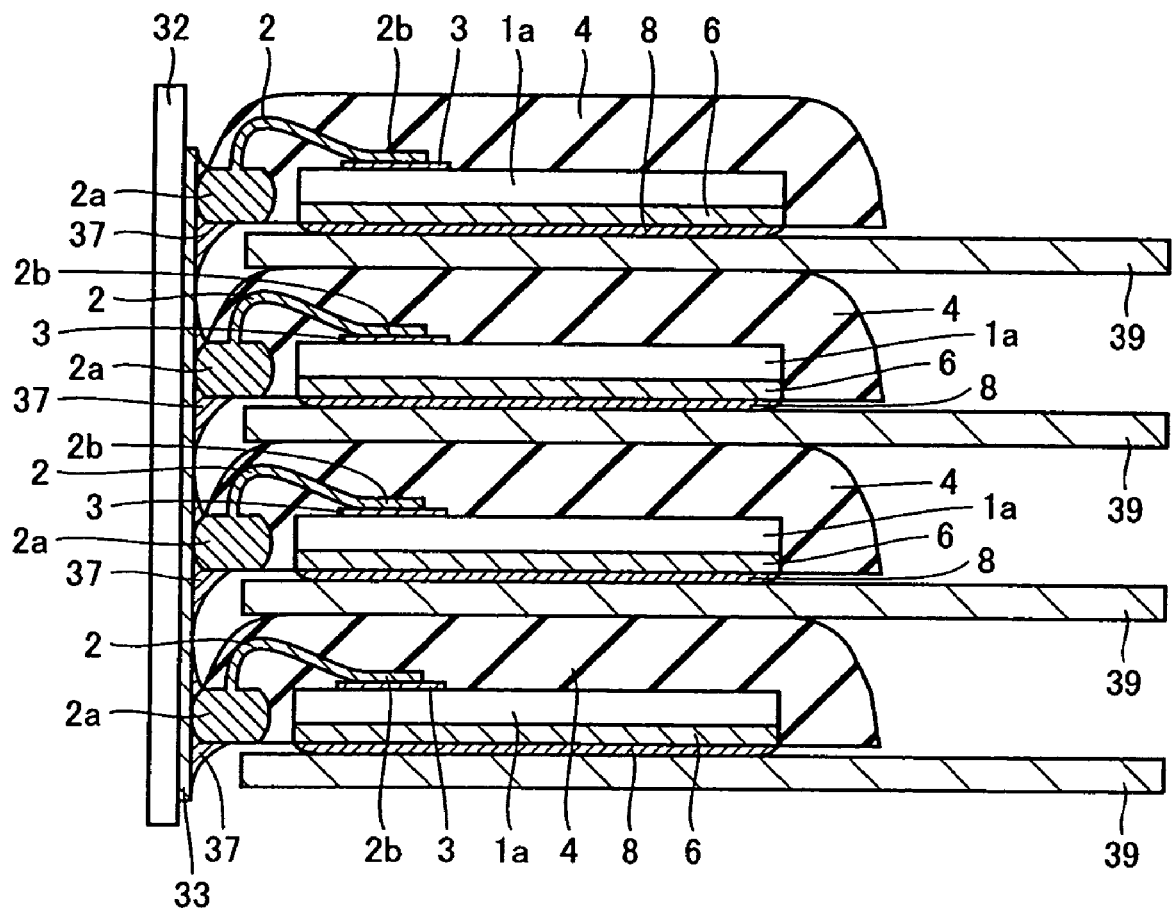
Figure 46:
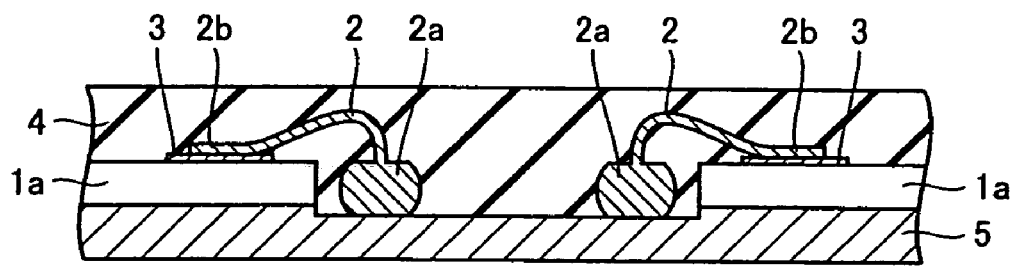
Figure 47:
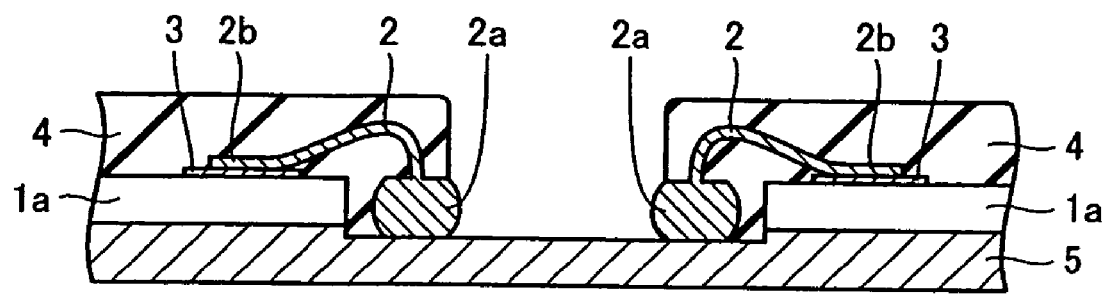
Figure 48:
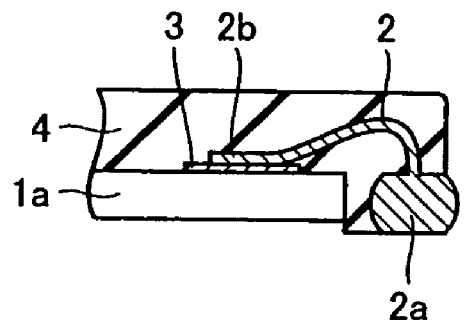
Figure 49:
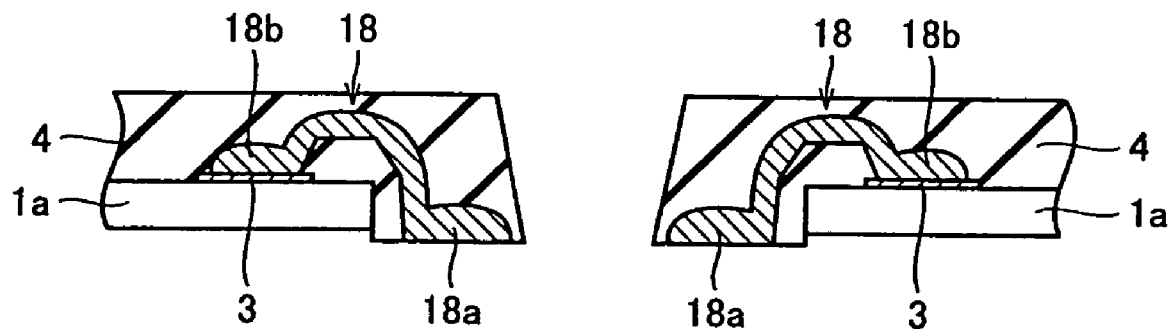
Figure 50:
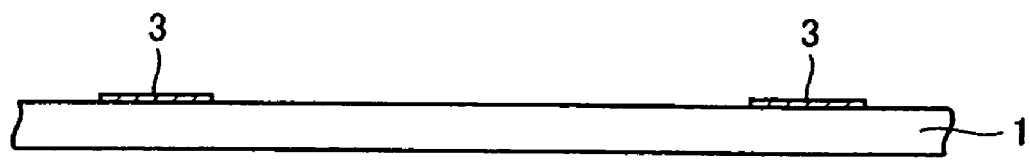
Figure 51:
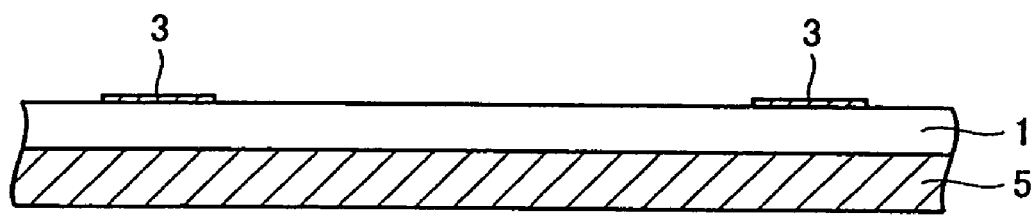
Figure 52:
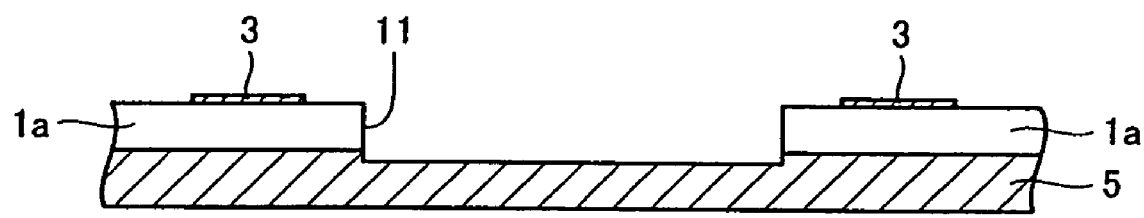
Figure 53:
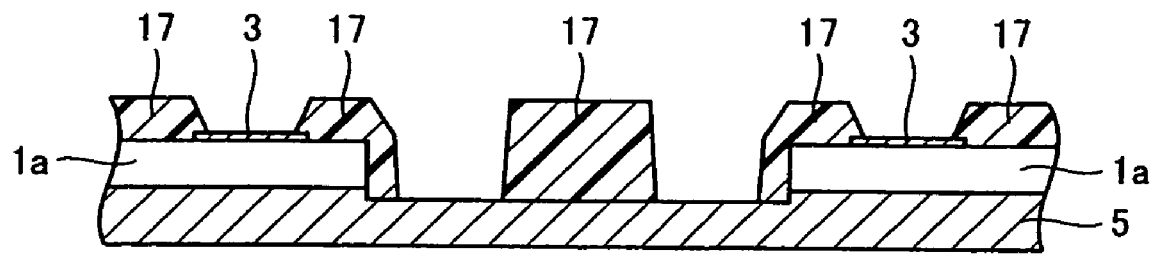
Figure 54:
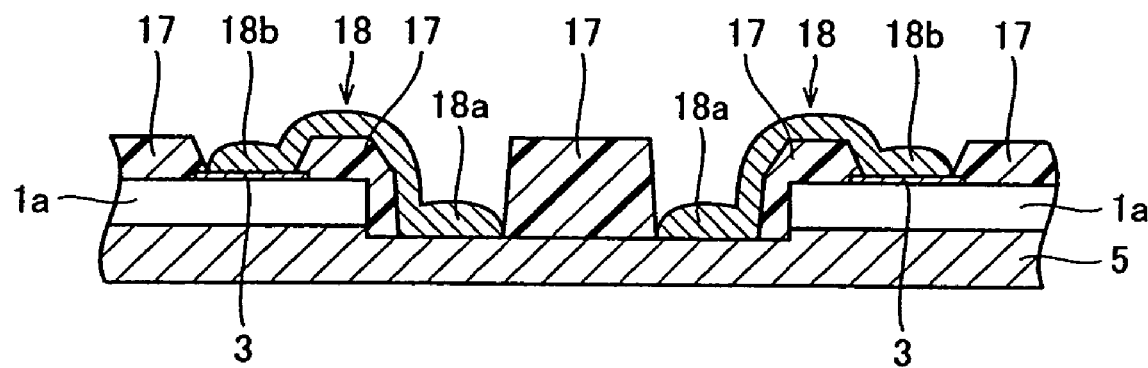
Figure 55:
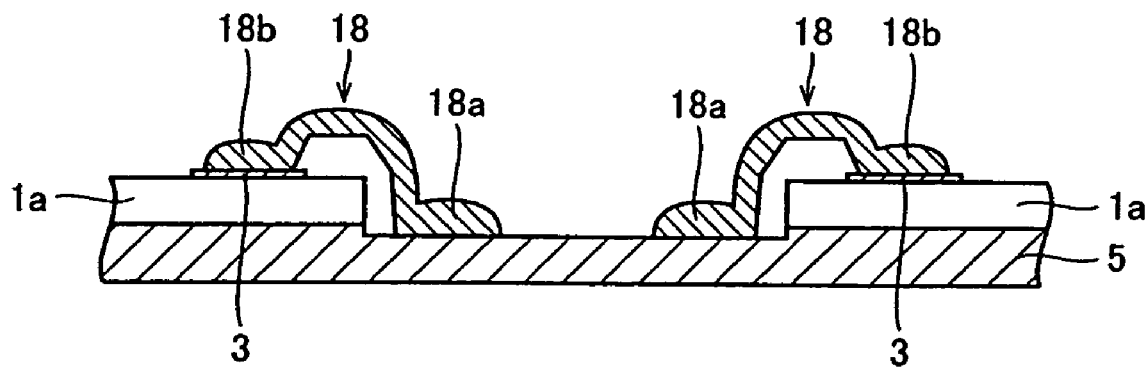
Figure 56:
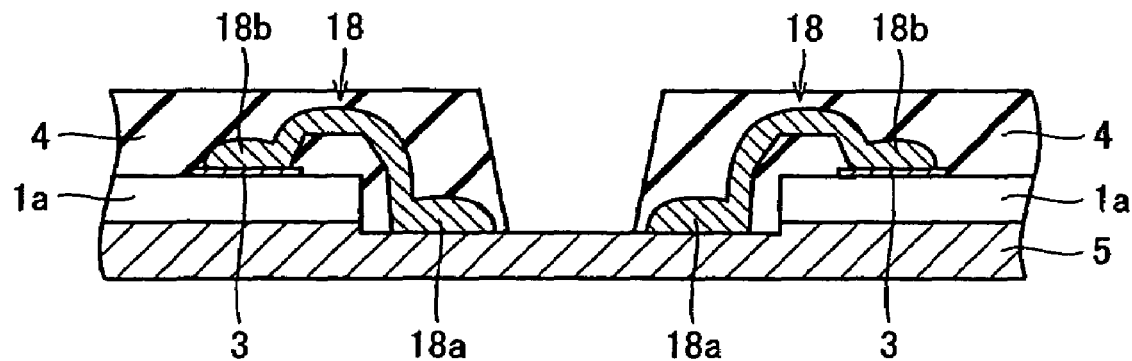
Figure 57:
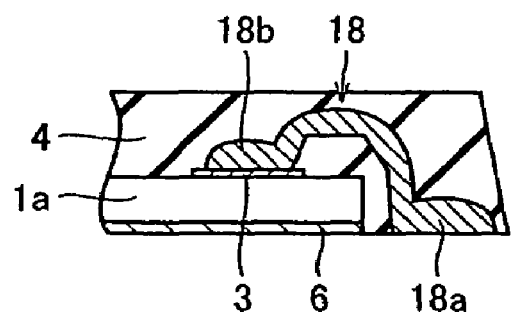
Figure 58:
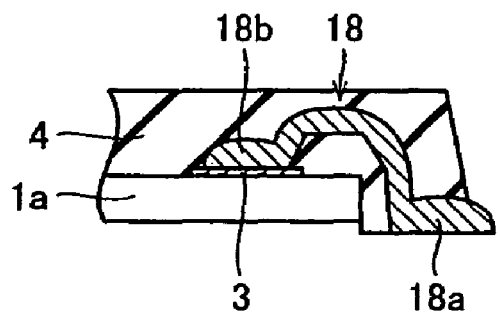
Figure 59:
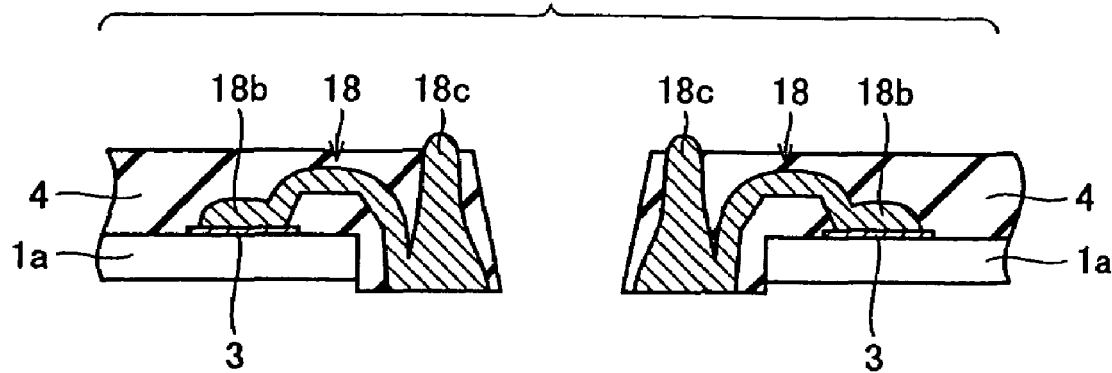
Figure 60:
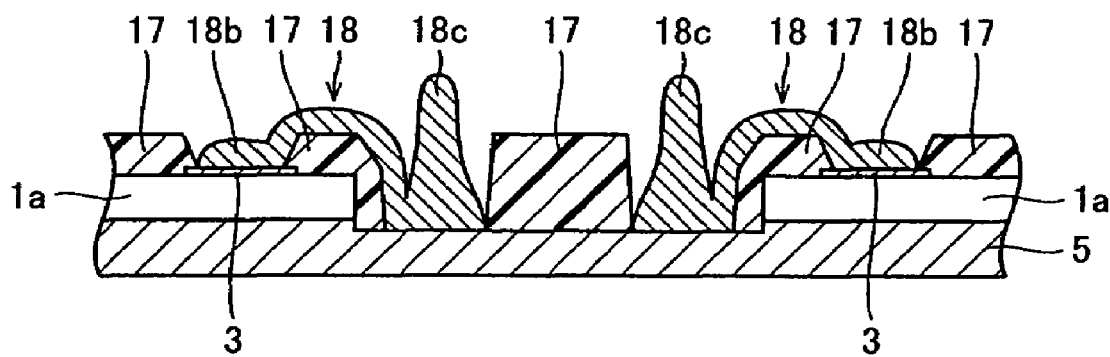
Figure 61:
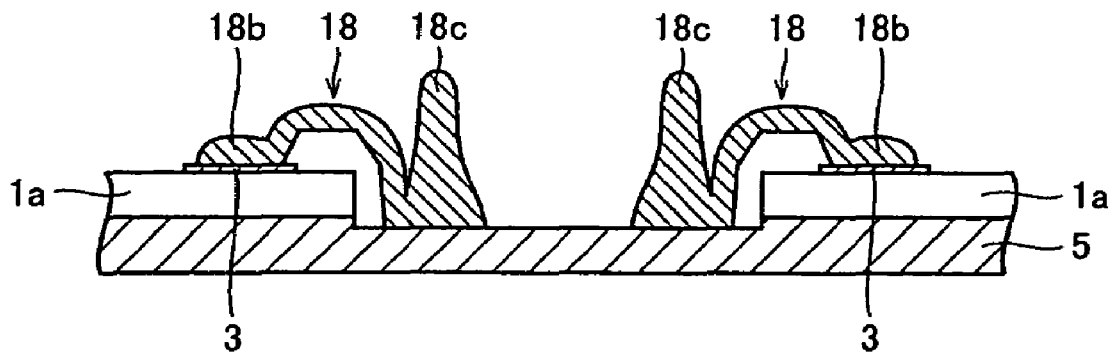
Figure 62:
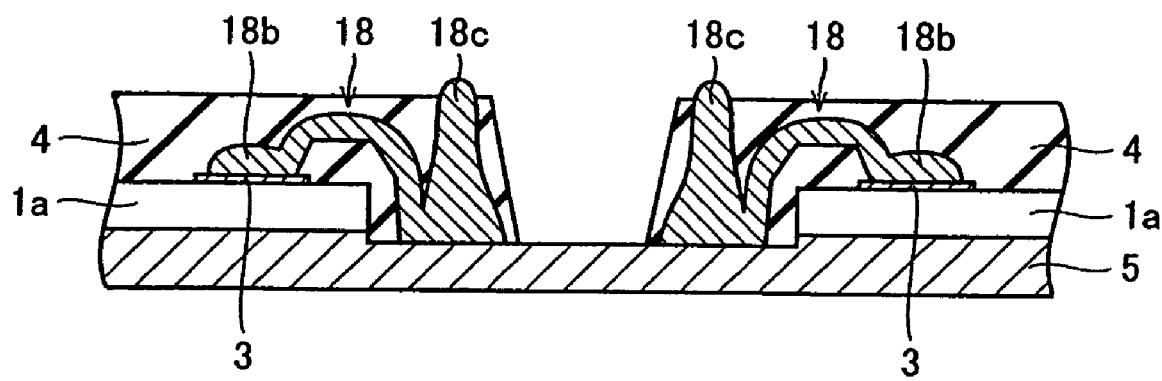
Figure 63:
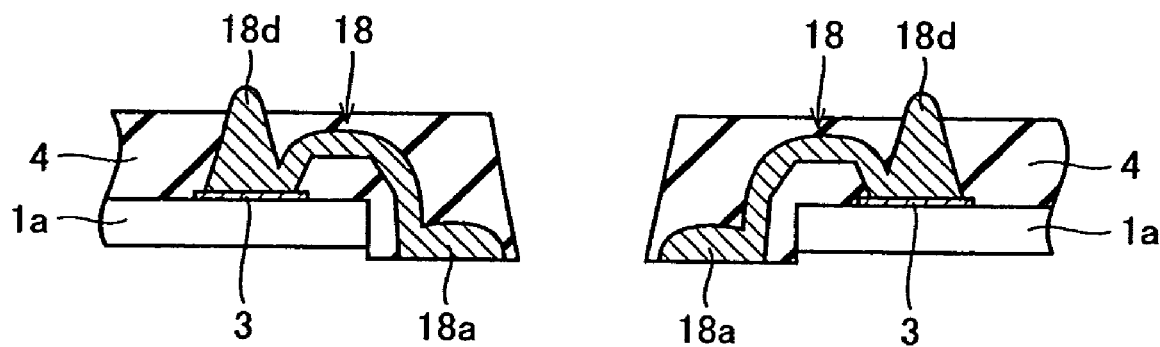
Figure 64:
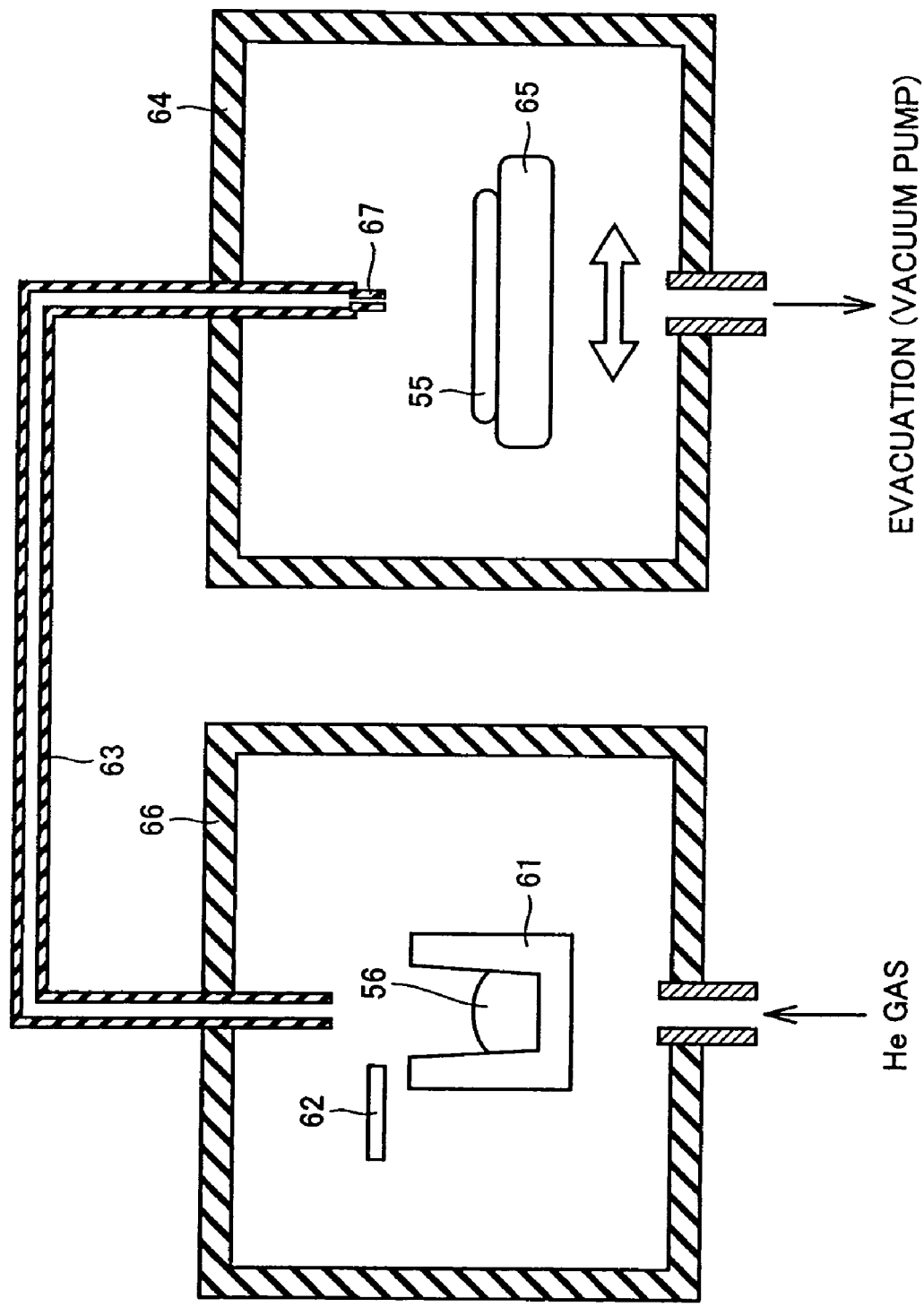
Figure 65:
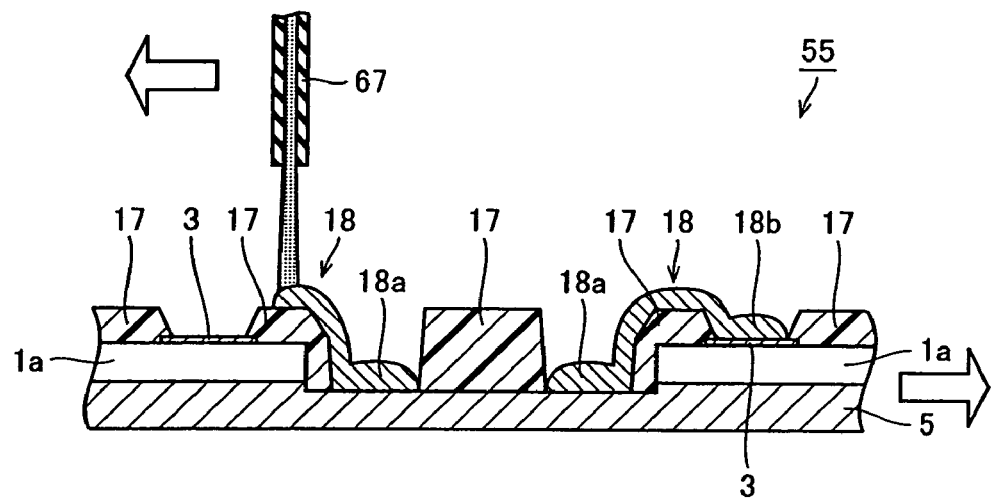
Figure 66:
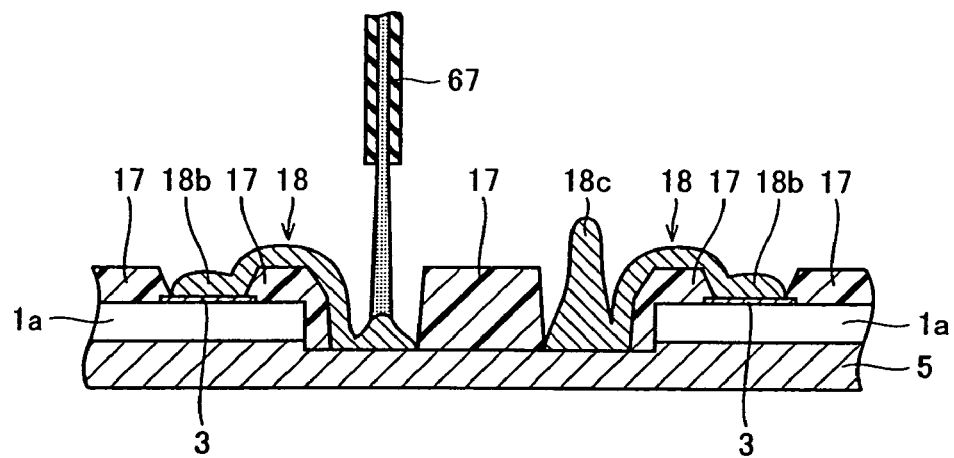
Figure 67:
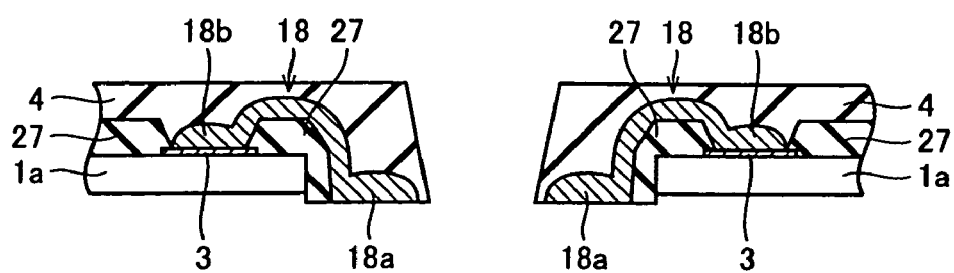
Figure 68:
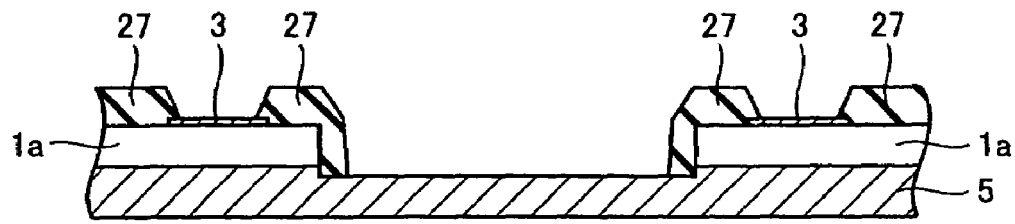
Figure 69:
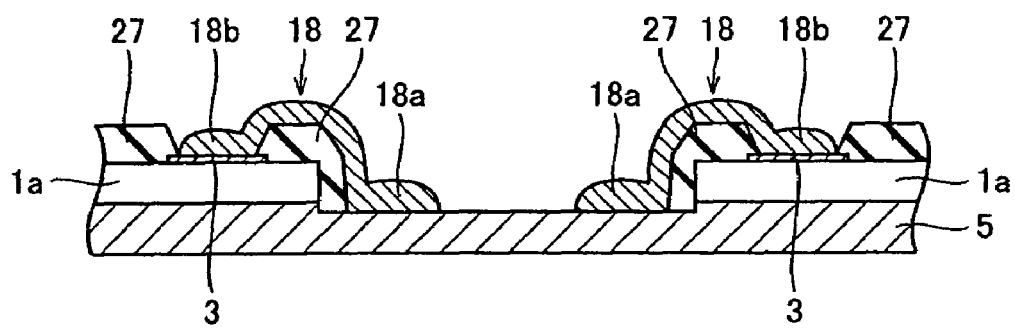
Figure 70:
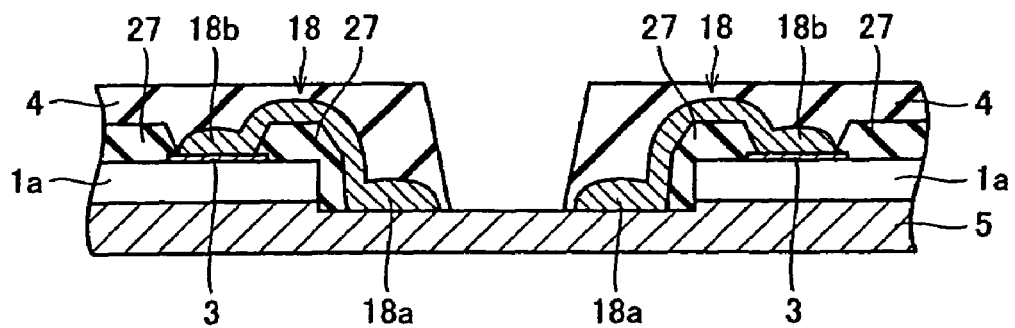
Figure 71:
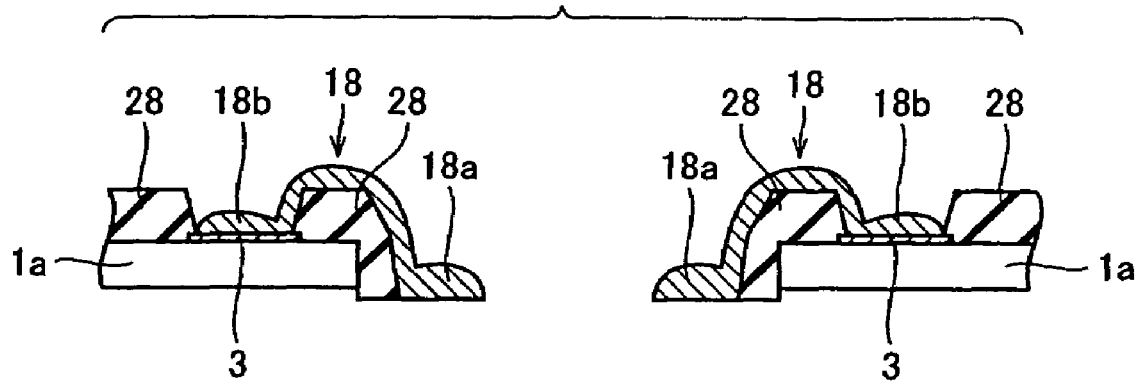
Figure 72:
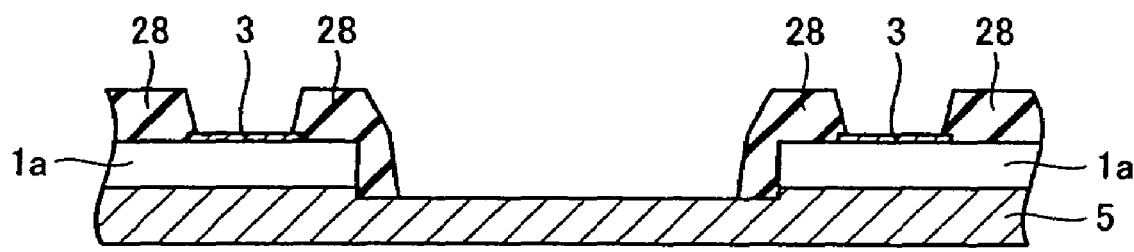
Figure 73:
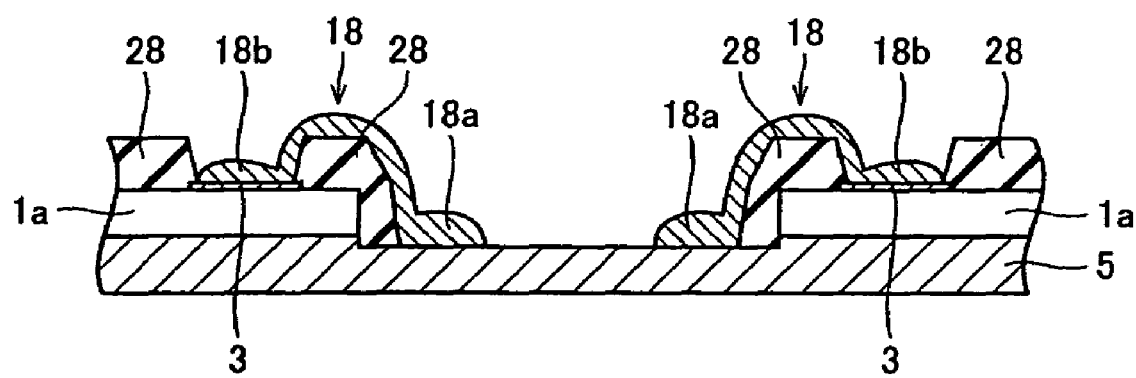
Figure 74:
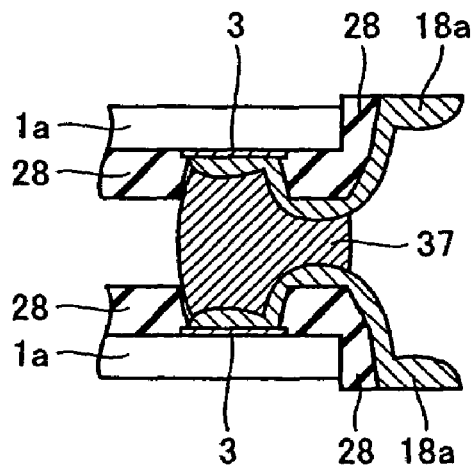
Figure 75:
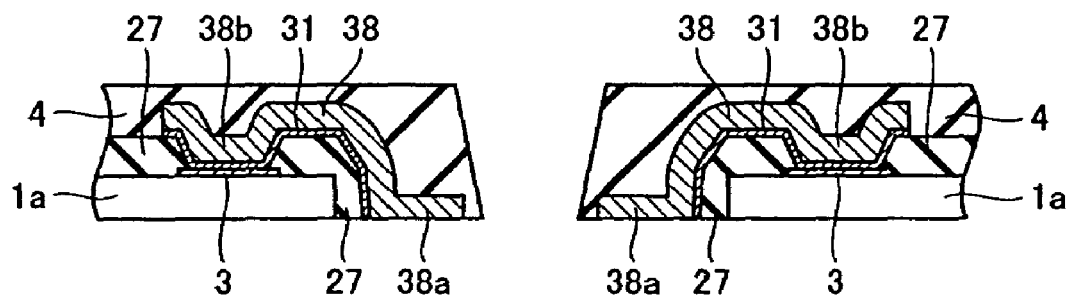
Figure 76:
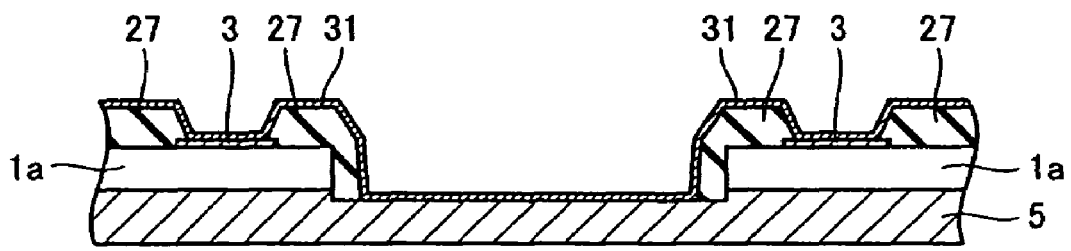
Figure 77:
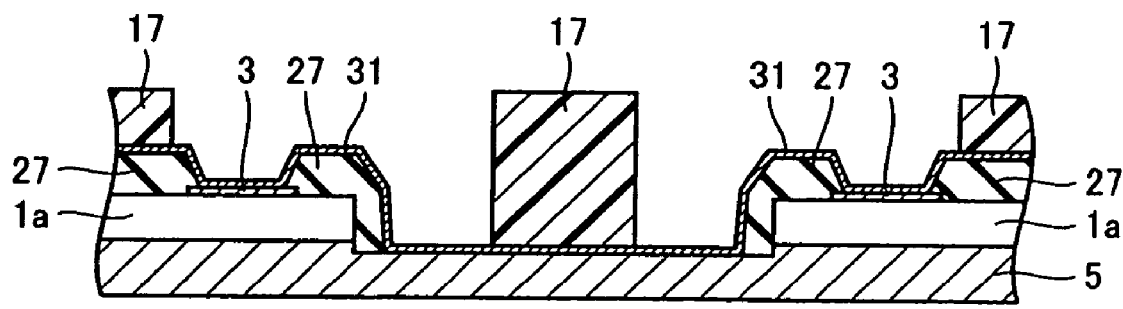
Figure 78:
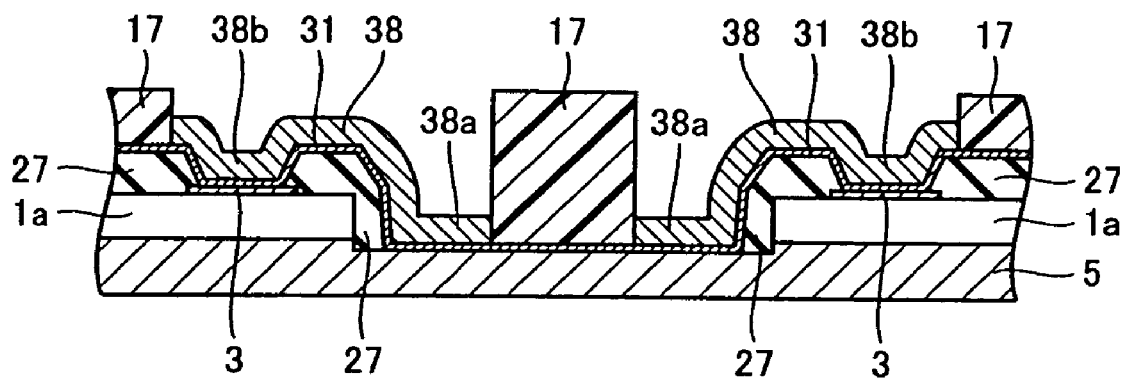
Figure 79:
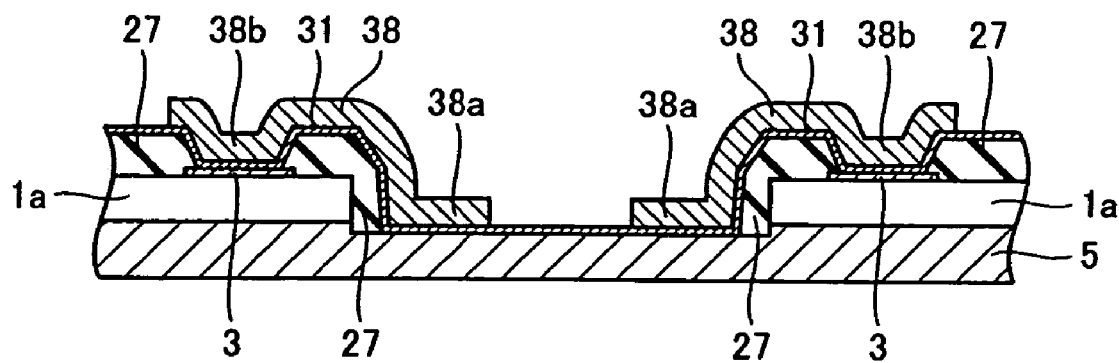
Figure 80:
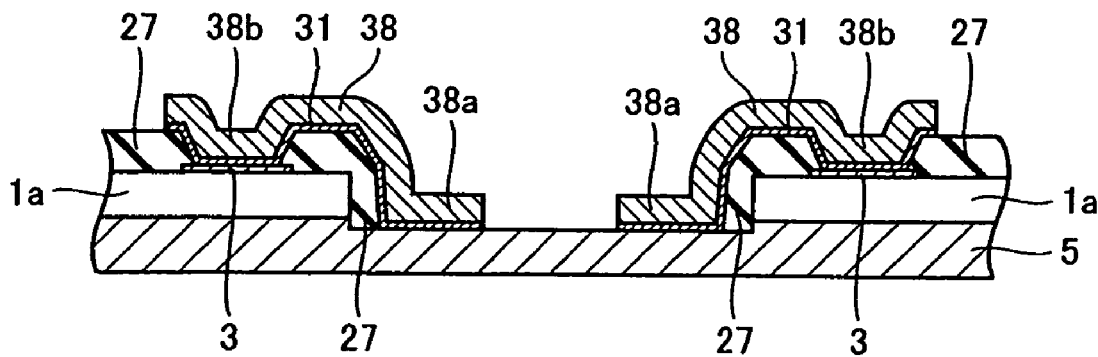
Figure 81:
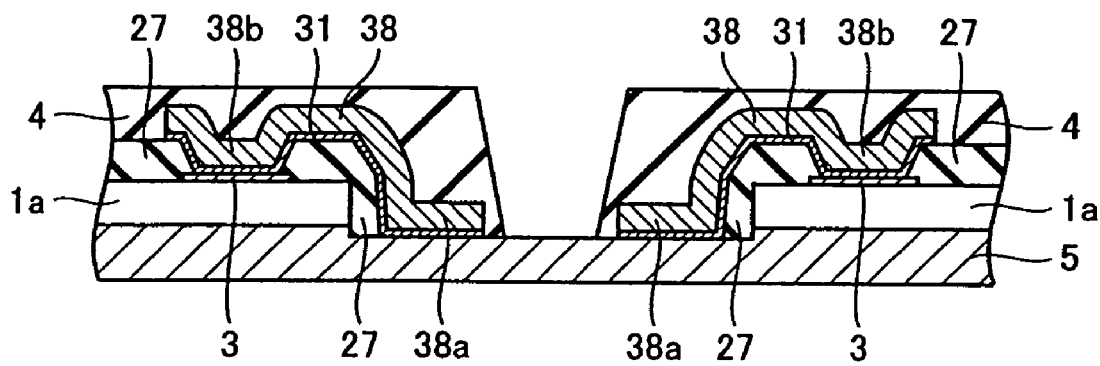
Figure 82:
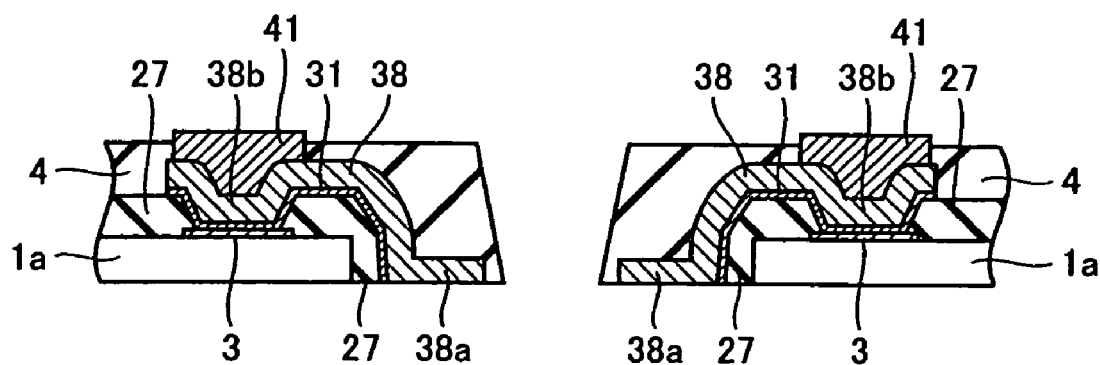
Figure 83:
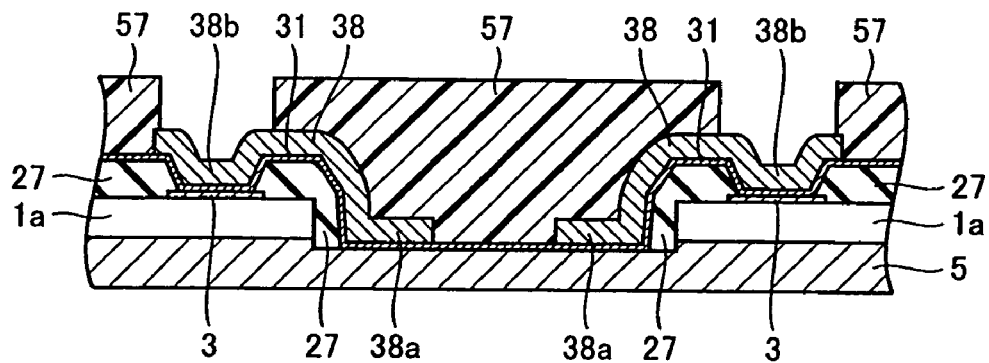
Figure 84:
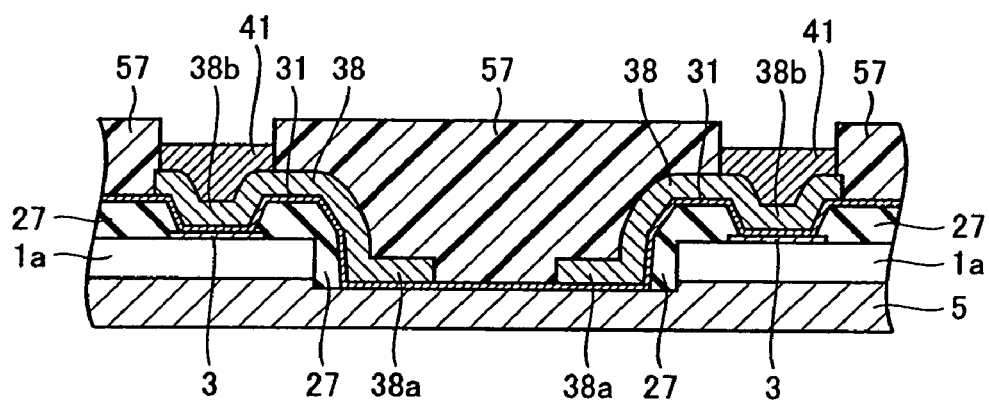
Figure 85:
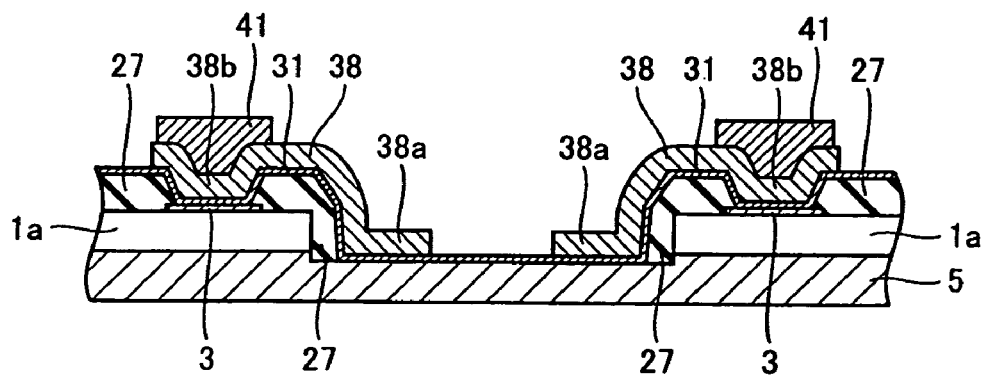
Figure 86:
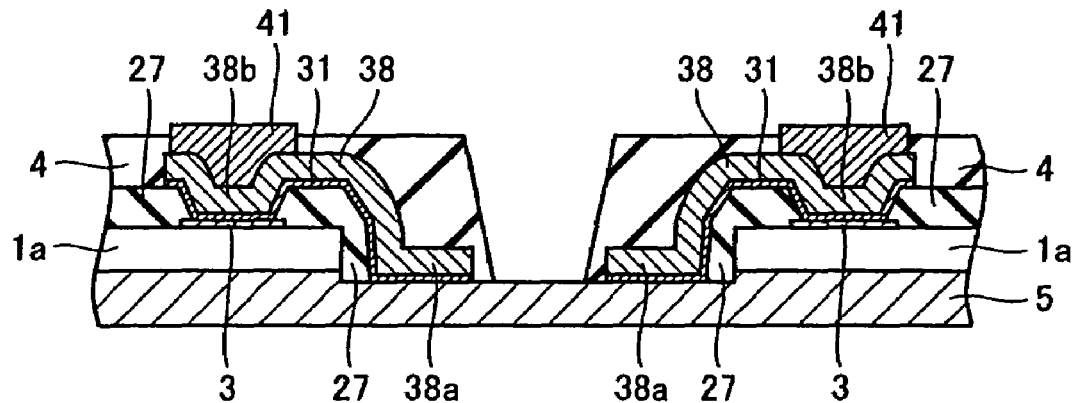
Figure 87:
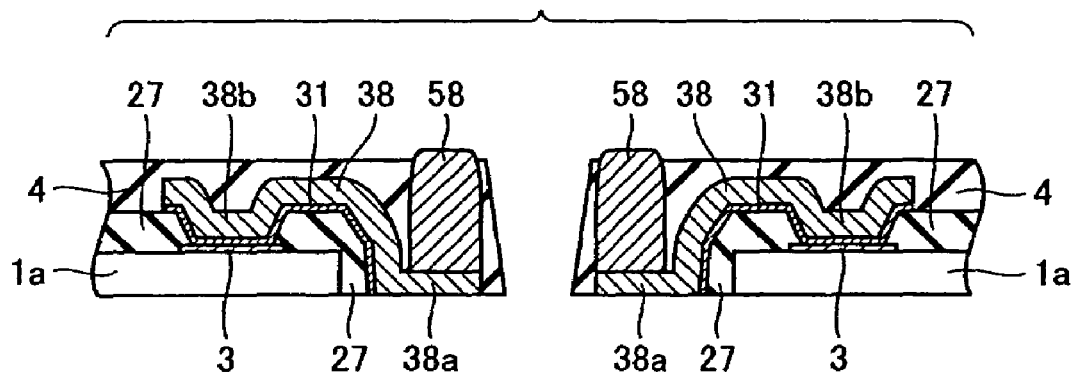
Figure 88:
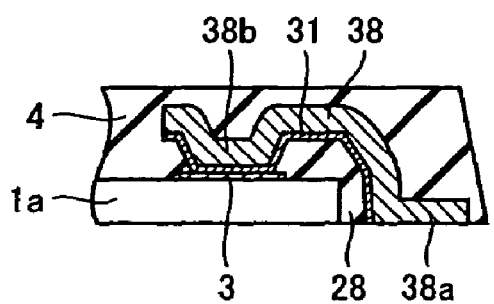
Figure 89:
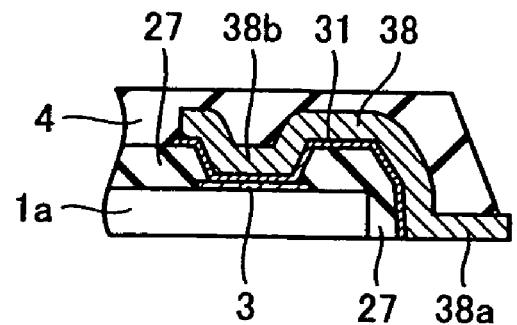
Figure 90:
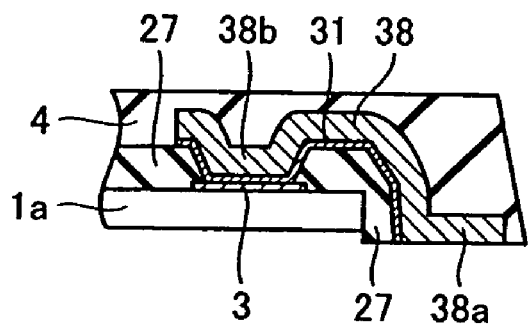
Figure 91:
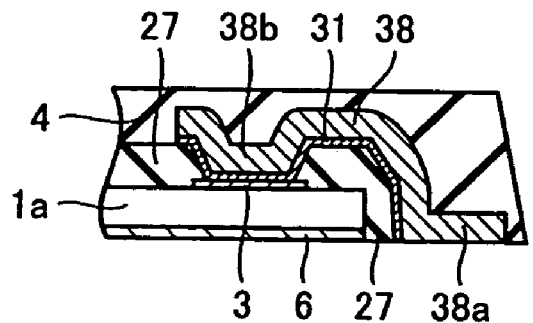
Figure 92:
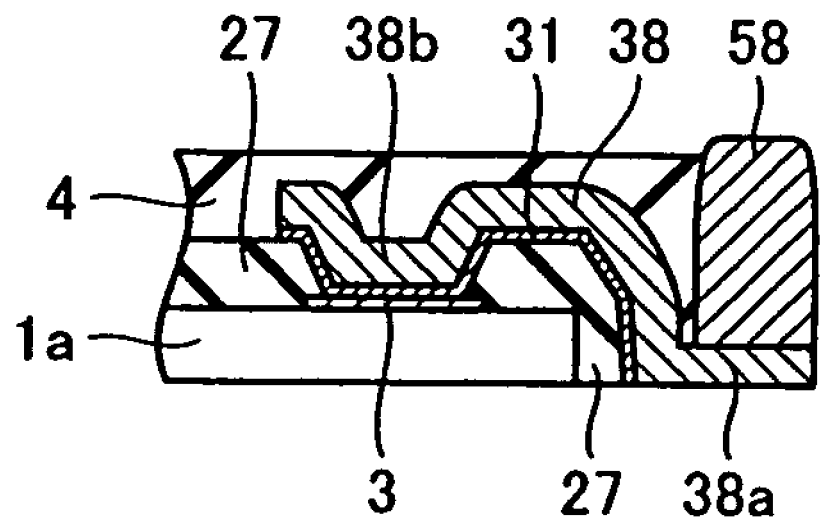
Figure 93:
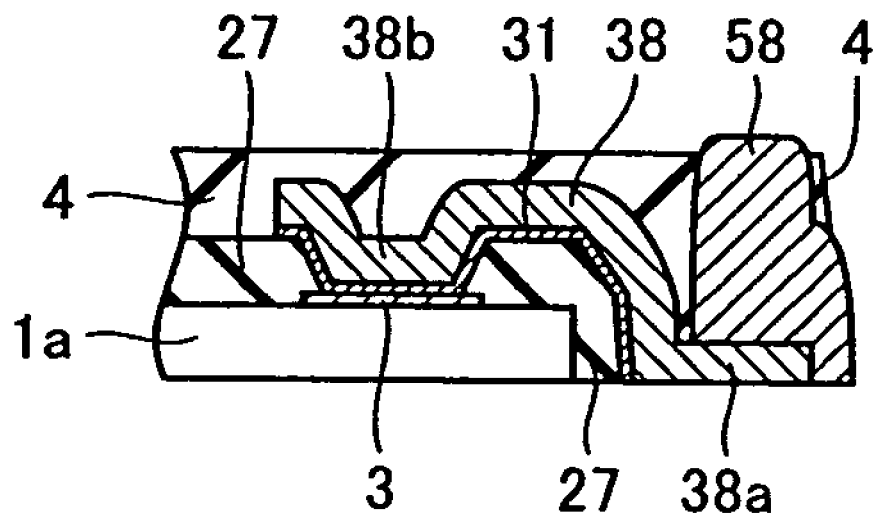
Figure 94:
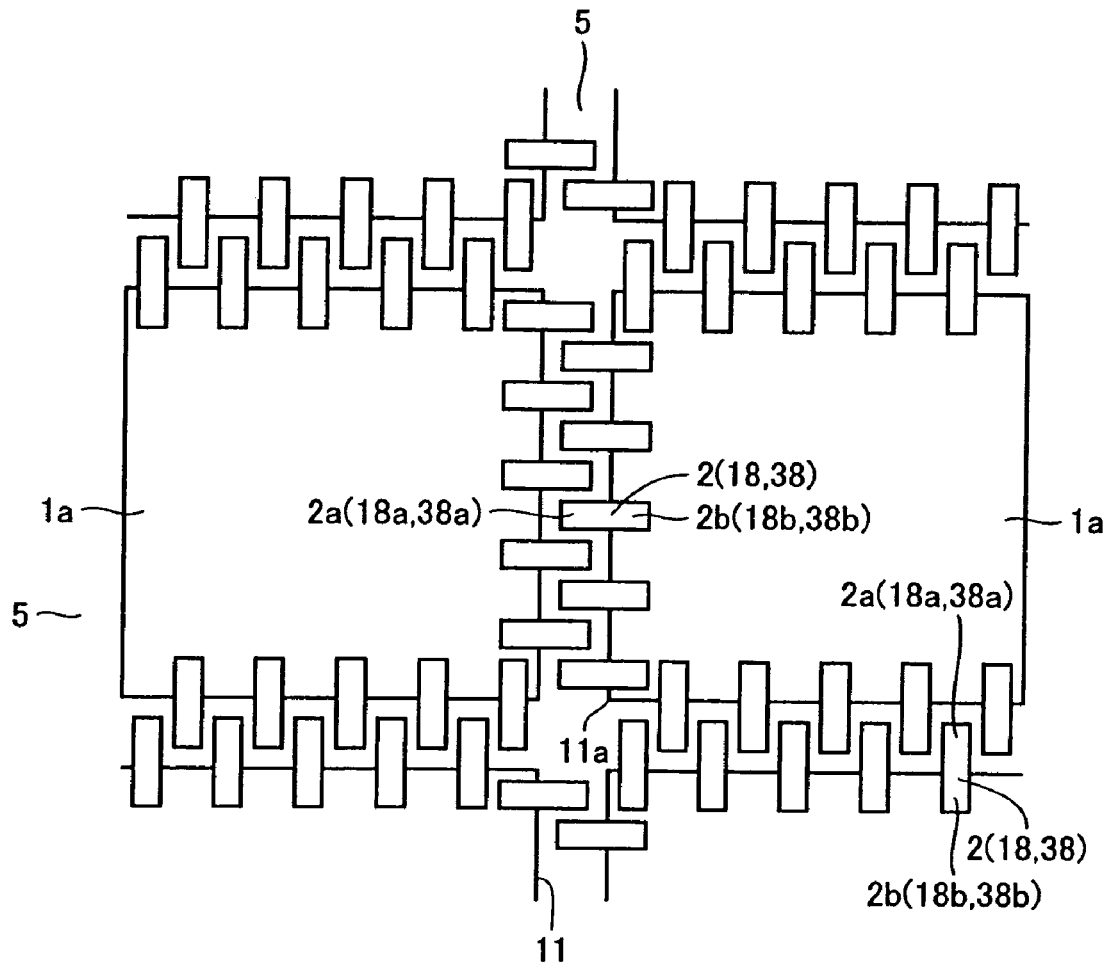
Figure 95:
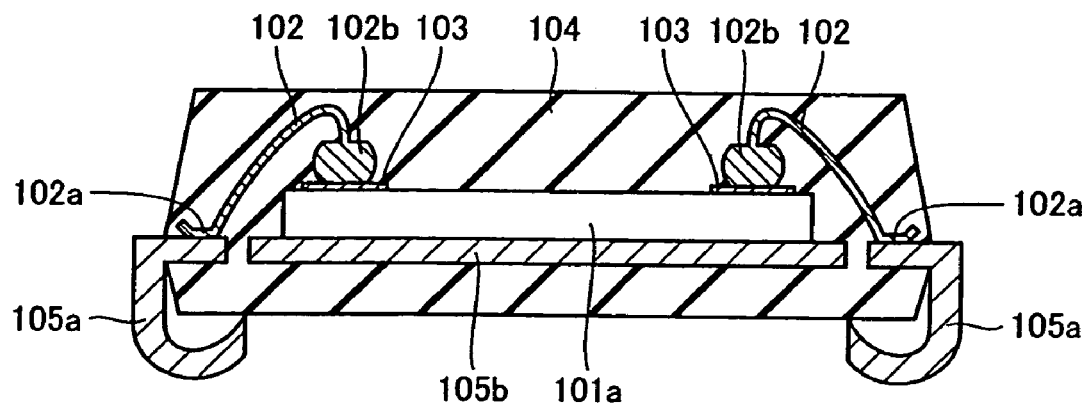
Figure 96:
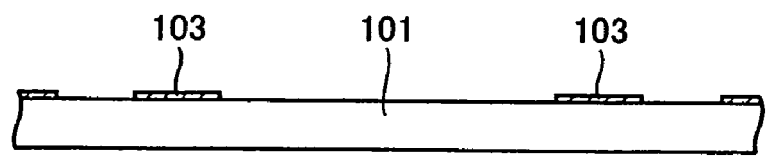
Figure 97:
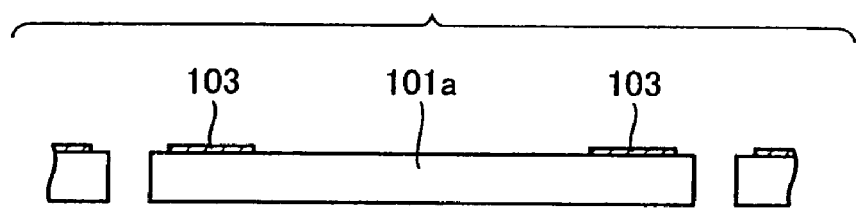
Figure 98:
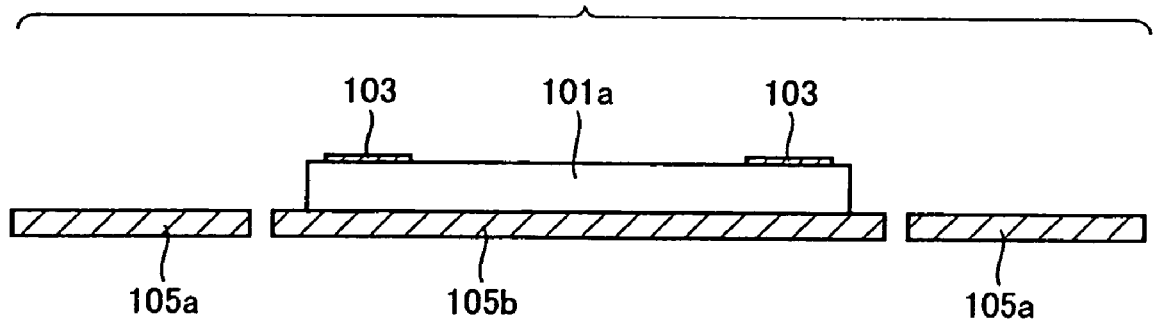
Figure 99:
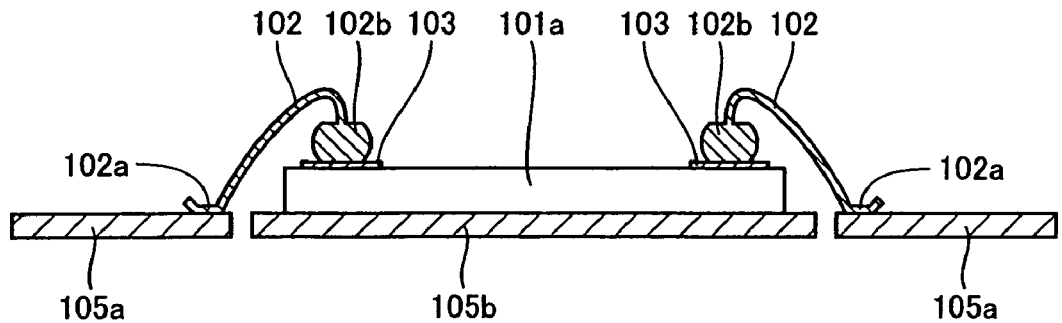
Figure 100:
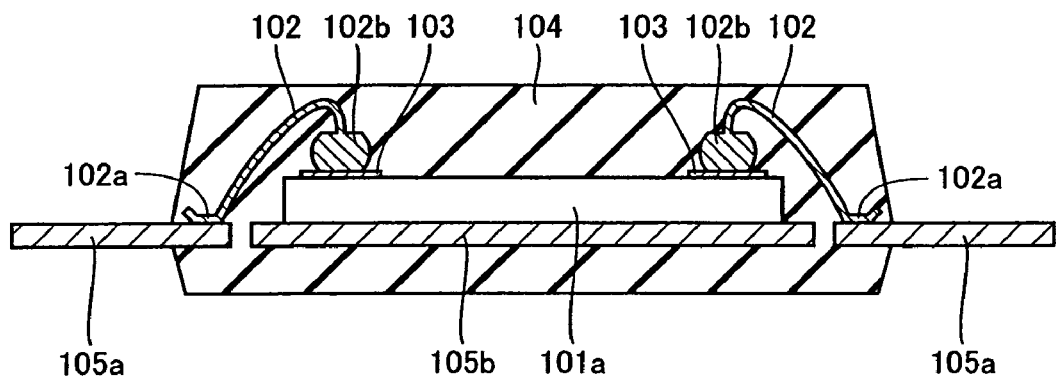
Figure 101:
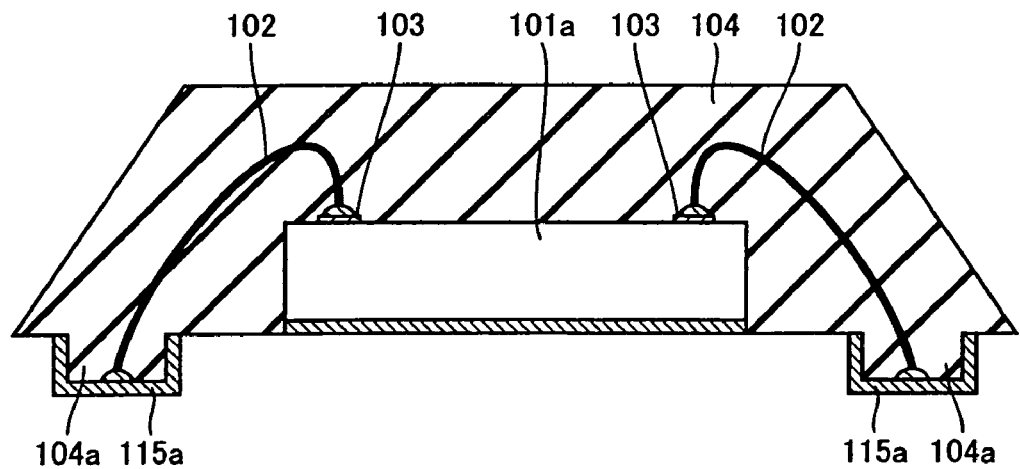
Figure 102:
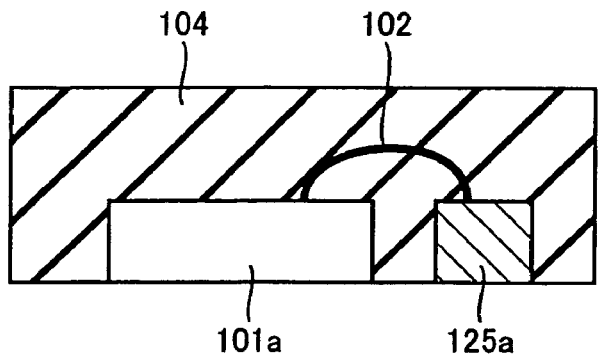
Figure 103:
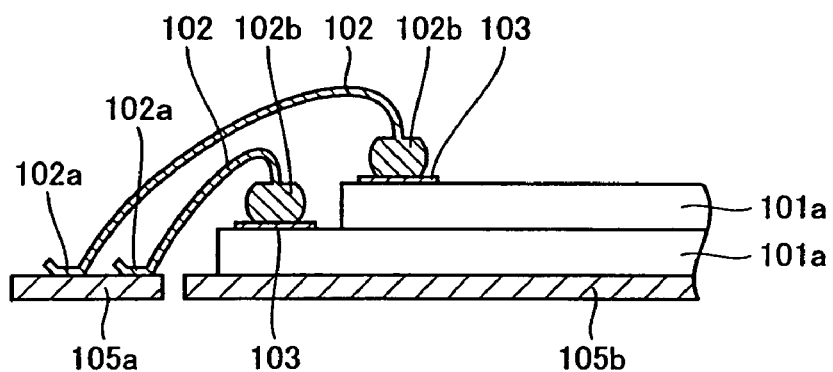
Figure 104:
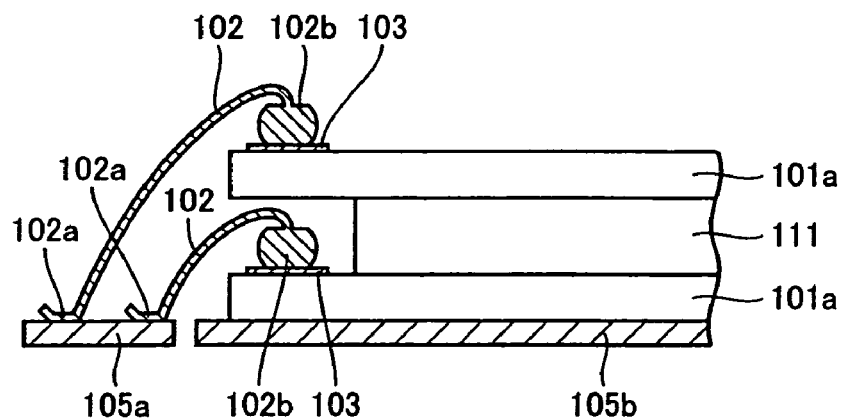

33 and a semiconductor device face-symmetrical thereto (the semiconductor device itself may correspond thereto) with each other;

FIG. 35 is a sectional view of a semiconductor device having a two-layer structure formed by butt-jointing the upper surfaces of the semiconductor device show in FIG. 33 and a semiconductor device face-symmetrical thereto (the semiconductor device itself may correspond thereto) with each other;

FIG. 36 is a sectional view showing a semiconductor device having a four-layer structure formed by successively stacking two semiconductor devices having the two-layer structure shown in FIG. 35;

FIG. 37 is a sectional view of a semiconductor device having a three-layer structure according to the eighth embodiment of the present invention;

FIG. 38 is a sectional view showing a stage after forming sealing resin patterns to expose side portions of connecting terminals in a method of fabricating semiconductor devices according to a ninth embodiment of the present invention;

FIG. 39 is a plan view of the semiconductor device shown in FIG. 38;

FIG. 40 is a sectional view showing a stage after removing a support plate sown in FIG. 38;

FIG. 41 is a plan view of a semiconductor device, fragmented by removing resin from the intersection between the trenches shown in FIG. 40, as viewed from the back side;

FIG. 42 is a sectional view showing a stage after mounting the semiconductor device shown in FIG. 41 on a circuit board;

FIG. 43 is a sectional view showing a multilayer semiconductor device formed by mounting the semiconductor devices shown in FIG. 41 on wall circuit boards;

FIG. 44 is a sectional view showing a semiconductor device of a multilayer structure formed by arranging the semiconductor devices shown in FIG. 41 on a wall circuit board while arranging no wall circuit board on at least single sides but arranging planar circuit boards to project outward from the single sides;

FIG. 45 is a sectional view showing a semiconductor device of a multilayer structure formed by arranging the semiconductor device shown in FIG. 41 on a wall circuit board while arranging no wall circuit board on at least single sides but arranging heat slingers to project outward from the single sides;

FIG. 46 is a sectional view showing a stage after covering a wafer with resin to cover semiconductor chips and wires without employing resin pattern forming means in a method of fabricating semiconductor devices according to a tenth embodiment of the present invention;

FIG. 47 is a sectional view showing a stage after forming an isolation trench with a dicing saw to expose side portions of connecting terminals shown in FIG. 46;

FIG. 48 is a sectional view showing a semiconductor device fragmented by removing a support plate shown in FIG. 47;

FIG. 49 illustrates two semiconductor devices according to an eleventh embodiment of the present invention holding a trench therebetween immediately after removal of a support plate;

FIG. 50 illustrates a state after polishing a wafer and forming electrodes in fabrication of the semiconductor devices shown in FIG. 49;

FIG. 51 illustrates a state after bonding the support plate to the back surface of the wafer;

FIG. 52 illustrates a state after providing the trench reaching the support plate through the wafer;

FIG. 53 illustrates a state after providing resist patterns;

FIG. 54 illustrates a state after forming metal wires by gas deposition;

FIG. 55 illustrates a state after removing the resist patterns;

FIG. 56 illustrates a state sealed with sealing resin;

FIG. 57 illustrates a modification of the semiconductor device according to the eleventh embodiment of the present invention;

FIG. 58 illustrates another modification of the semiconductor device according to the eleventh embodiment of the present invention;

FIG. 59 illustrates two semiconductor devices according to a twelfth embodiment of the present invention holding a trench therebetween immediately after removal of a support plate;

FIG. 60 illustrates a state after mounding connecting terminals upward on the support plate by gas deposition in fabrication of the semiconductor devices shown in FIG. 59;

FIG. 61 illustrates a state after removing resist patterns;

FIG. 62 illustrates a state sealed with sealing resin;

FIG. 63 illustrates two semiconductor devices according to a modification of the twelfth embodiment of the present invention holding a trench therebetween immediately after removal of a support plate;

FIG. 64 illustrates a gas deposition apparatus employed for a method of fabricating semiconductor devices according to a thirteenth embodiment of the present invention;

FIG. 65 illustrates a method of forming a metal wire with the apparatus shown in FIG. 64;

FIG. 66 illustrates a method of forming a connecting terminal of the metal wires with the apparatus shown in FIG. 64;

FIG. 67 illustrates two semiconductor devices according to a fourteenth embodiment of the present invention holding a trench therebetween immediately after removal of a support plate;

FIG. 68 illustrates a state after forming insulator film patterns of polyimide or the like in fabrication of the semiconductor devices shown in FIG. 67;

FIG. 69 illustrates a state after forming metal wires by gas deposition;

FIG. 70 illustrates a state sealed with sealing resin;

FIG. 71 illustrates two semiconductor devices according to a fifteenth embodiment of the present invention holding a trench therebetween immediately after removal of a support plate;

FIG. 72 illustrates a state after forming patterns of sealing resin by screen printing, for example, in fabrication of the semiconductor devices shown in FIG. 71;

FIG. 73 illustrates a state after forming metal wires by gas deposition;

FIG. 74 illustrates a semiconductor device having a two-layer structure according to a sixteenth embodiment of the present invention;

FIG. 75 illustrates two semiconductor devices according to a seventeenth embodiment of the present invention holding a trench therebetween immediately after removal of a support plate;

FIG. 76 illustrates a state after forming a metal film by vapor deposition or the like in fabrication of the semiconductor devices shown in FIG. 75;

FIG. 77 illustrates a state after forming resist patterns;

FIG. 78 illustrates a state after forming metal wires by electroplating;

FIG. 79 illustrates a state after removing the resist patterns;

FIG. 80 illustrates a state after removing the metal film by etching through masks of the metal wires;

FIG. 81 illustrates a state sealed with sealing resin;

FIG. 82 illustrates two semiconductor devices according to an eighteenth embodiment of the present invention holding a trench therebetween immediately after removal of a support plate;

FIG. 83 illustrates a state after forming a second resist pattern in fabrication of the semiconductor devices shown in FIG. 82;

FIG. 84 illustrates a state after forming on-electrode terminals on openings of the second resist pattern by second electroplating;

FIG. 85 illustrates a state after removing the resist pattern;

FIG. 86 illustrates a state sealed with sealing resin;

FIG. 87 illustrates a modification of the semiconductor devices according to the eighteenth embodiment of the present invention;

FIG. 88 illustrates a semiconductor device according to a nineteenth embodiment of the present invention;

FIG. 89 illustrates a first modification of the semiconductor device according to the nineteenth embodiment of the present invention;

FIG. 90 illustrates a second modification of the semiconductor device according to the nineteenth embodiment of the present invention;

FIG. 91 illustrates a third modification of the semiconductor device according to the nineteenth embodiment of the present invention;

FIG. 92 illustrates a fourth modification of the semiconductor device according to the nineteenth embodiment of the present invention;

FIG. 93 illustrates a fourth modification of the semiconductor device according to the nineteenth embodiment of the present invention;

FIG. 94 illustrates a method of fabricating semiconductor devices according to a twentieth embodiment of the present invention;

FIG. 95 is a sectional view showing a conventional semiconductor device employing a lead frame;

FIG. 96 is a sectional view showing a stage after forming circuit areas of a plurality of semiconductor chips on a wafer in fabrication of the conventional semiconductor device shown in FIG. 95;

FIG. 97 is a sectional view showing a stage after separating the wafer shown in FIG. 96 into the respective semiconductor chips;

FIG. 98 is a sectional view showing a stage after loading one of the fragmented semiconductor chips shown in FIG. 97 on a lead frame;

FIG. 99 is a sectional view showing a stage after coupling electrodes of the semiconductor chip shown in FIG. 98 with external lead parts;

FIG. 100 is a sectional view showing a stage after sealing a semiconductor device shown in FIG. 99 with resin;

FIG. 101 illustrates a conventional miniaturized semiconductor device;

FIG. 102 illustrates another conventional miniaturized semiconductor device;

FIG. 103 illustrates a multilayer structure of a conventional semiconductor device; and FIG. 104 illustrates another multilayer structure of a conventional semiconductor device.

DESCRIPTION OF THE PREFERRED EMBODIMENTS

Embodiments of the present invention are now described with reference to the drawings.

(First Embodiment)

Figure 1:
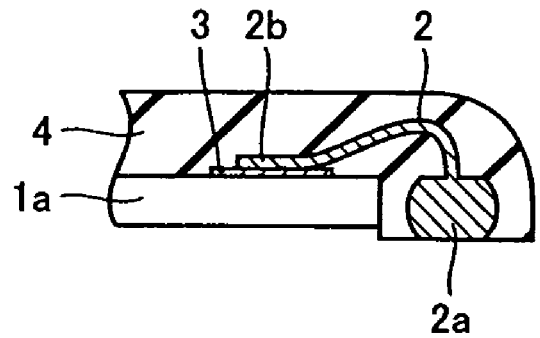
FIG. 1 is a sectional block diagram showing a semiconductor device according to a first embodiment of the present invention.

Referring to FIG. 1, a semiconductor chip 1a and a wire 2 are sealed with insulating resin 4 in a semiconductor device according to a first embodiment of the present invention. A first end 2b of the wire 2 is connected to an electrode 3 of the semiconductor chip 1a, to form the so-called stitch bond. A second end of the wire 2 defines a worked and bulked connecting terminal 2a exposed from the sealing resin 4. The exposed surface of the connecting terminal 2a projects outward beyond the semiconductor chip 1a.

According to this structure, the connecting terminal 2a can be formed by simply melting the second end of the wire 2. Thus, (a) the semiconductor device can be readily miniaturized, and (b) the production efficiency is remarkably improved and the fabrication cost can be reduced due to the extremely simplified structure. Further, the connecting terminal 2a projecting outward beyond the semiconductor chip 1a can be readily and reliably connected with another terminal without much improving the dimensional accuracy of this semiconductor device.

(Second Embodiment)

Figure 2:
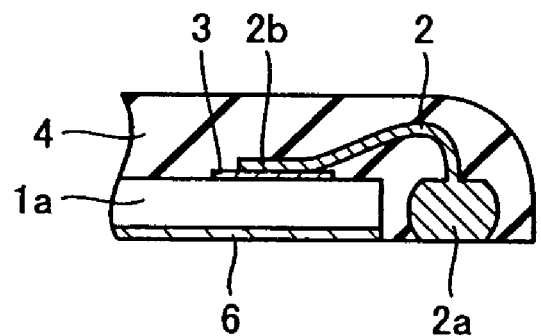
FIG. 2 is a sectional block diagram showing a semiconductor device according to a second embodiment of the present invention.

Referring to FIG. 2, the feature of a semiconductor device according to a second embodiment of the present invention resides in that a plate member 6 is arranged on the back surface of a semiconductor chip 1a. A metal plate can be generally employed for this plate member 6. The plate member 6 can be readily formed by partially changing a method of fabricating a semiconductor device described later.

The mechanical strength such as rigidity of the semiconductor device can be improved by arranging the aforementioned plate member 6. When the plate member 6 is made of a heat conductive member such as a metal plate, heat radiation from the semiconductor chip 1a can be improved.

(Third Embodiment)

Figure 3:
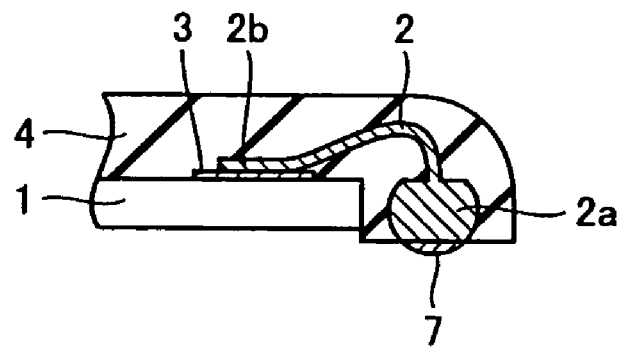
FIG. 3 is a sectional block diagram showing a semiconductor device according to a third embodiment of the present invention.

Referring to FIG. 3, the feature of a semiconductor device according to a third embodiment of the present invention resides in that a solder coat 7 is formed on a surface of a connecting terminal 2a exposed on the back surface of the semiconductor device. The connecting terminal 2a can be readily and reliably connected to a terminal of a circuit board or the like due to the formation of the solder coat 7, for attaining high connection strength.

(Fourth Embodiment)

Figure 4:
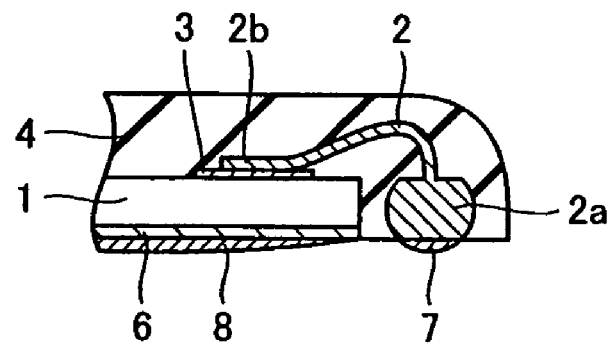
FIG. 4 is a sectional block diagram showing a semiconductor device according to a fourth embodiment of the present invention.

Referring to FIG. 4, the feature of a semiconductor device according to a fourth embodiment of the present invention resides in that a plate member is formed by a metal plate 6 arranged on the back surface of a semiconductor chip, and this metal plate 6 is also covered with a solder coat 8 in addition to a connecting terminal 2a. When the semiconductor device is loaded on a circuit board, adhesion strength and heat radiation can be improved due to the formation of the solder coat 8.

(Fifth Embodiment)

Figure 5:
FIG. 5 is a sectional view showing a stage after forming a plurality of circuit patterns for semiconductor chips on a wafer in a method of fabricating semiconductor devices according to a fifth embodiment of the present invention.

FIGS. 5 to 20 illustrate a method of fabricating semiconductor devices according to a fifth embodiment of the present invention. Any of the semiconductor devices according to the aforementioned first to fourth embodiments can be fabricated by this method. First, patterns provided with circuit areas are formed on regions of respective semiconductor chips 1a on the main surface of a wafer (semiconductor substrate) 1, as shown in FIG. 5. The circuit areas have prescribed functions, and include electrodes 3 for attaining electrical connection with an external device. The back surface of the wafer 1 may be ground and adjusted to a prescribed thickness, or may not be ground.

Figure 6:
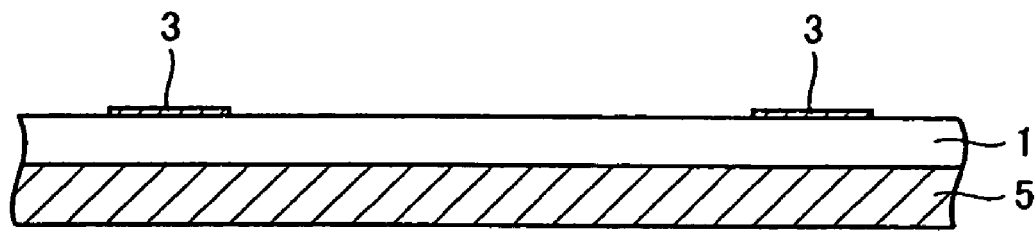
FIG. 6 is a sectional view showing a stage after bonding a support plate to the back surface of the wafer shown in FIG. 5.
Figure 7:
FIG. 7 is a sectional view showing a stage after forming a trench between circuit areas of the semiconductor chips shown in FIG. 6 by dicing.

Then, a support plate 5 is bonded to the back surface of the wafer 1, as shown in FIG. 6. A metal plate of aluminum or the like can be employed for the support plate 5. The support plate 5 is preferably bonded by anode connection.

Alternatively, the support plate 5 can be bonded with an adhesive. Thereafter a trench 11 is so formed that a peripheral part of the circuit area of each semiconductor chip 1a reaches the support plate 5. This trench 11 can be formed with a dicing saw, for example. The trench 11 passes through the wafer 1 to reach the support plate 5 and form a shallow groove also in the support plate 5.

Etching, plating or combination of etching and plating may be carried out on the exposed surface of the support plate 5, in order to facilitate connection of wires 2 in a subsequent wire bonding step. Such etching, plating or combination of etching and plating can be readily performed on the exposed part of the support plate 5 by general processing. This processing is also effective for improving the strength of the connected portions, in addition to the effect of implementing simple and reliable connection of the wires 2.

Figure 8:
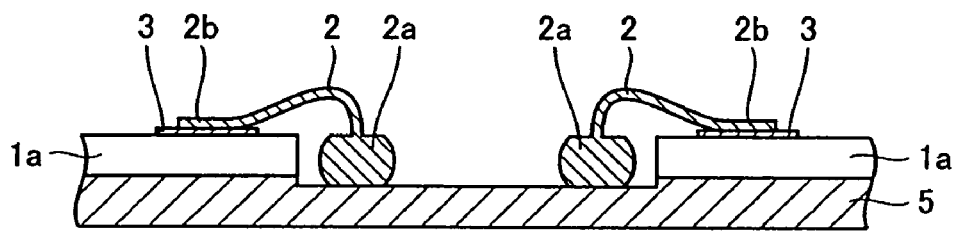
FIG. 8 is a sectional view showing a stage after forming bulk connecting terminals on support plate connecting parts for connecting the support plate shown in FIG. 7 with electrodes of the semiconductor chips.
Figure 9:
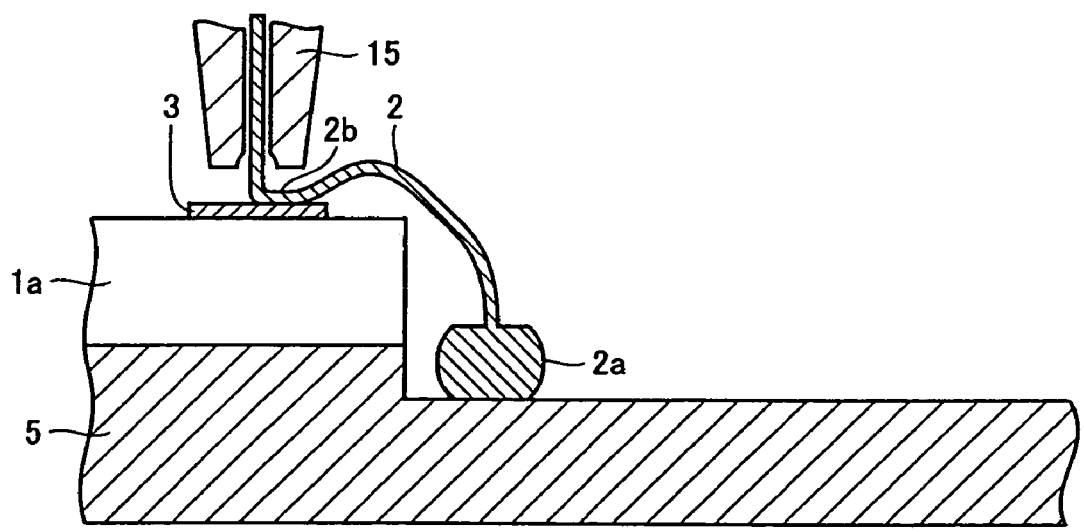
FIG. 9 illustrates a situation of forming a ball bond by wire bonding as each connecting terminal shown in FIG. 8.

Then, an electrode 3 of each semiconductor chip 1a is connected with the support plate 5 located on the bottom portion of the trench 11 by the so-called wire bonding (FIG. 8). A part of the wire 2 in contact with the bottom of the trench 11 is melted into a spherical form, for forming the so-called ball bond. In wire bonding, the forward end of the wire 2 is discharged and melted in a wire bonding apparatus, for forming a bulk part (ball) 2a. Then, the ball 2a is properly grown and connected to the support plate 5, as shown in FIG. 9. Then, the wire 2 is supplied from a torch 15 and connected to the electrode 3 of the semiconductor chip 1a for forming a stitch bond. Alternatively, wire bonding conditions can be adjusted for forming the stitch bond on the electrode 3 first and thereafter forming the ball bond on the support plate 5.

Further, a dent or a through hole can be previously arranged on the support plate 5 for pressing an end of the wire 2 with a torch and fitting/connecting the end in/to the dent or the through hole when connecting the end of the wire. Alternatively, the end of the wire can be strongly pressed with a torch to be fitted/connected with the support plate, without previously providing a dent or a through hole in the support plate. When the aforementioned connecting method is employed and etching is employed for removing the support plate in the later step, the end of the wire further projects outward. Consequently, the aforementioned connecting terminal can be further readily connected with another terminal.

Figure 10:
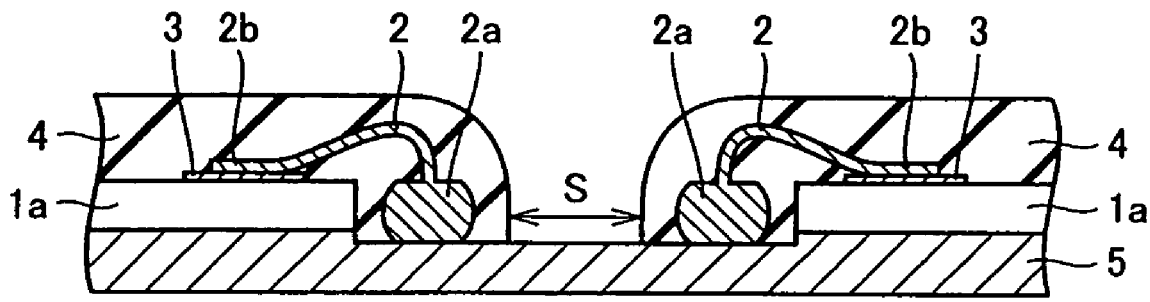
FIG. 10 is a sectional view showing semiconductor devices in a stage after forming resin patterns covering the semiconductor chips and the wires shown in FIG. 8 with a space.

Then, the semiconductor chips 1a and the wires 2 are covered with resin, which is an insulator, as shown in FIG. 10. At this time, a thermosetting polymeric material having flowability is screen-printed so that no resin is arranged in a space S between adjacent semiconductor chips 1a. Depending on the situation, however, resin is arranged on intersections between trenches or the like so that semiconductor devices are not fragmented immediately after the support plate 5 is removed. Alternatively, resin may be arranged in the space S in response to the situation. Thereafter post-heat treatment is performed for hardening the thermosetting polymeric material.

Figure 11:
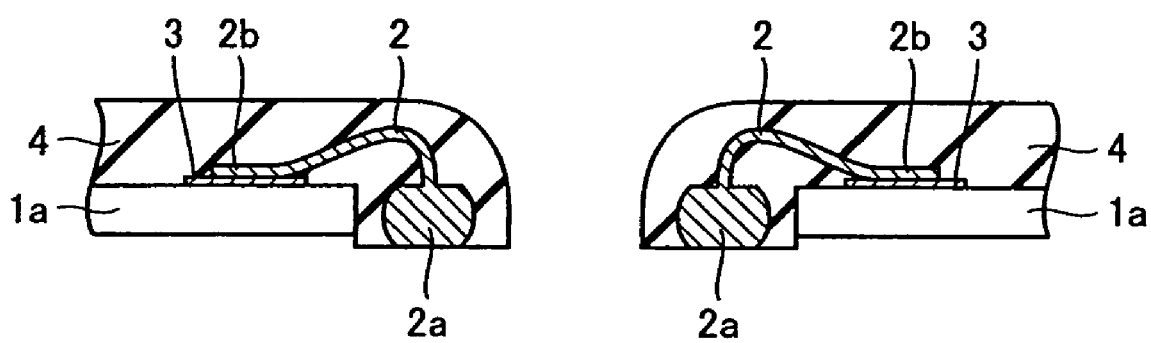
FIG. 11 is a sectional view showing the semiconductor devices in a stage after removing the support plate shown in FIG. 10 by wet etching.

Then, the support plate 5 is removed from the back surfaces of the semiconductor devices by wet etching, as shown in FIG. 11. The support plate 5 can be removed by mechanical polishing or chemical mechanical polishing (CMP), in place of wet etching. When mechanical polishing or CMP is employed, however, exposed surfaces of the connecting terminals 2a and the back surfaces of the semiconductor chips 1a are flush with each other and no connecting terminals 2a can project outward beyond the semiconductor chips 1a.

Then, the resin arranged on the intersections of the trenches etc. is removed for forming fragmented semiconductor devices. When no resin is arranged in the space S including the intersections of the trenches, however, the semiconductor devices are fragmented by removing the support plate 5 and hence the resin arranged on the intersections of the trenches may not be removed.

Figure 12:
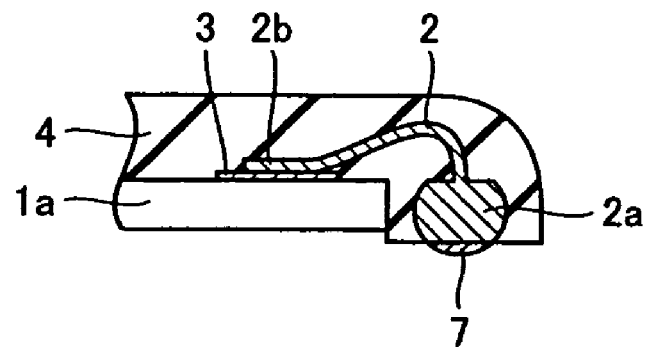
FIG. 12 is a sectional view of one of the semiconductor devices fragmented from the state shown in FIG. 11.
Figure 13:
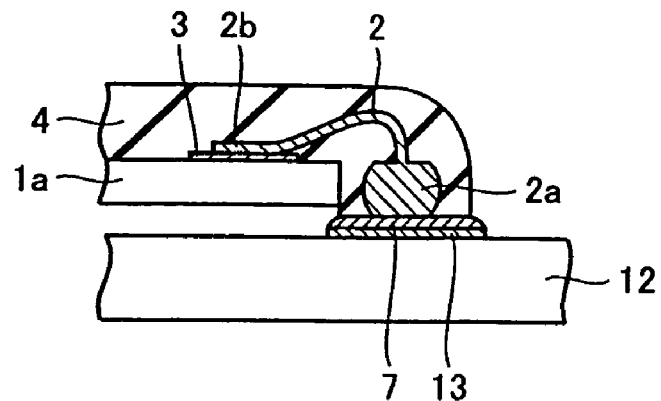
FIG. 13 is a sectional view showing a stage after mounting the semiconductor device of FIG. 12 on a circuit board.

Then, a solder coat 7 is formed on the connecting terminal 2a exposed on the back surface of each semiconductor device, as shown in FIG. 12. The solder coat 7 can be employed as a jointing material. A method of forming this solder coat 7 may not be limited to plating but another covering method can be employed. Then, the solder coat 7 is connected with an electrode 13 provided on a circuit board 12 (FIG. 13).

Figure 14:
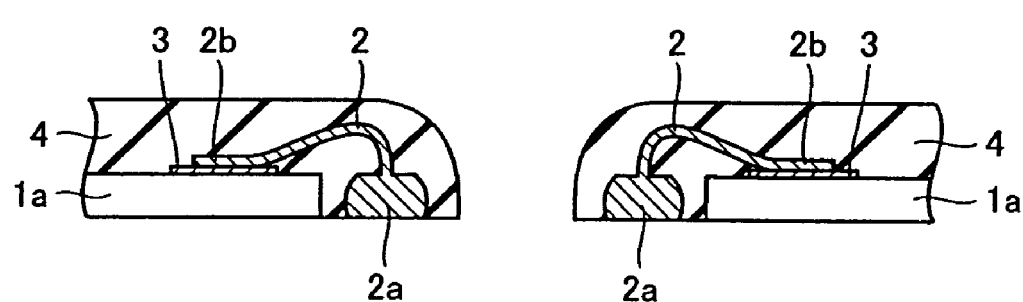
FIG. 14 is a sectional view showing an example removing the support plate shown in FIG. 10 by polishing.
Figure 15:
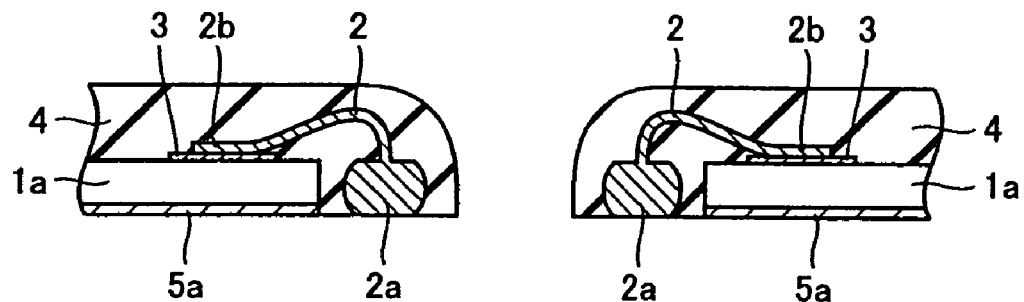
FIG. 15 is a sectional view showing another example removing the support plate shown in FIG. 10 by polishing.

Each of FIGS. 14 and 15 is a sectional view showing a state after removing the support plate 5 not by wet etching but by mechanical polishing or CMP. In this case, the exposed surfaces of the connecting terminals 2a are flush with the back surfaces of the semiconductor chips 1a as shown in FIG. 14, or parts 5a of the support plate 5 may be left on the back surfaces of the semiconductor chips 1a as shown in FIG. 15 to be employed as the plate member 6 shown in FIG. 2.

Figure 16:
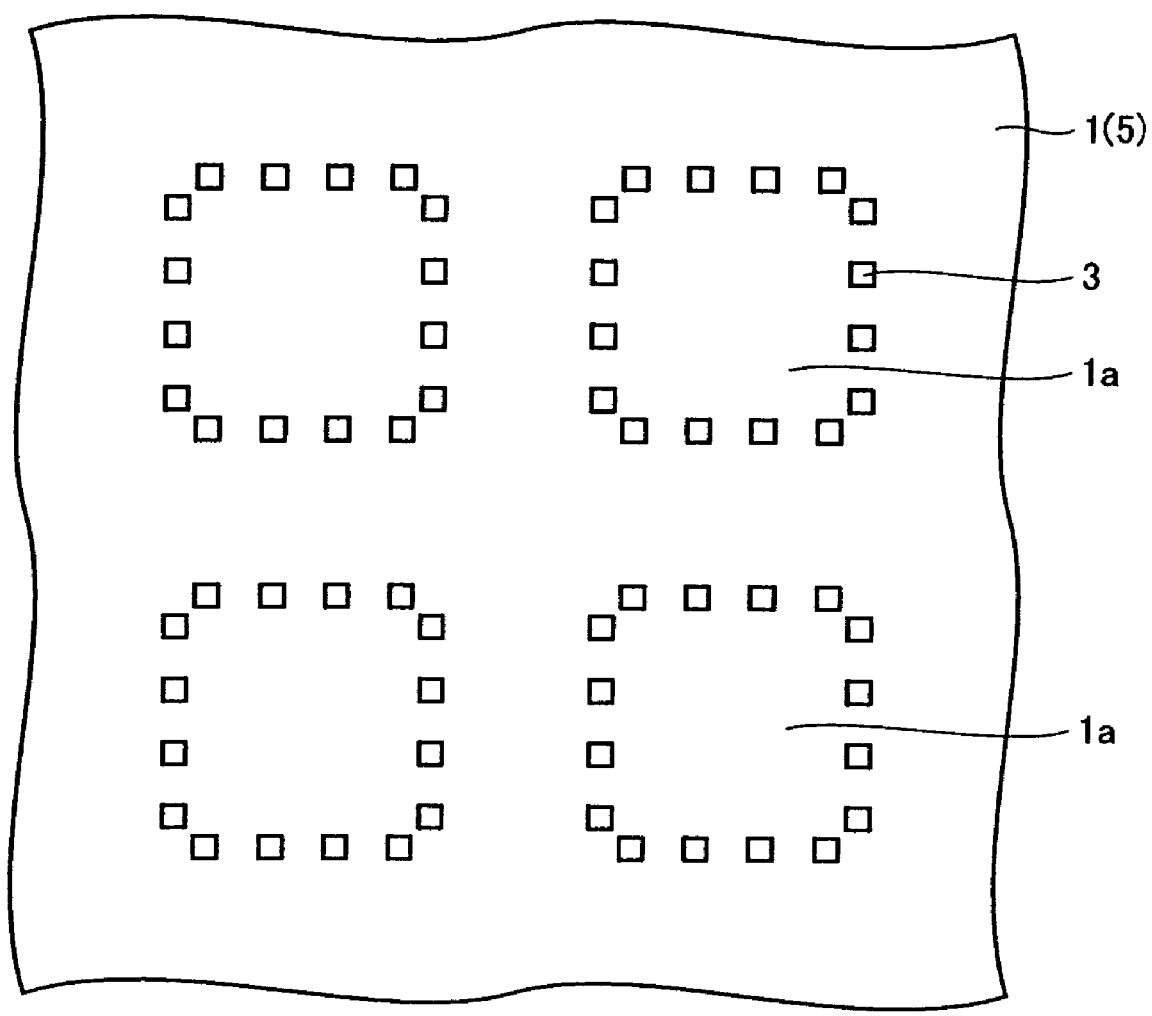
FIG. 16 is a plan view, corresponding to FIG. 6, showing the state of bonding the support plate to the back surface of the wafer after forming the circuits of the semiconductor chips.
Figure 17:
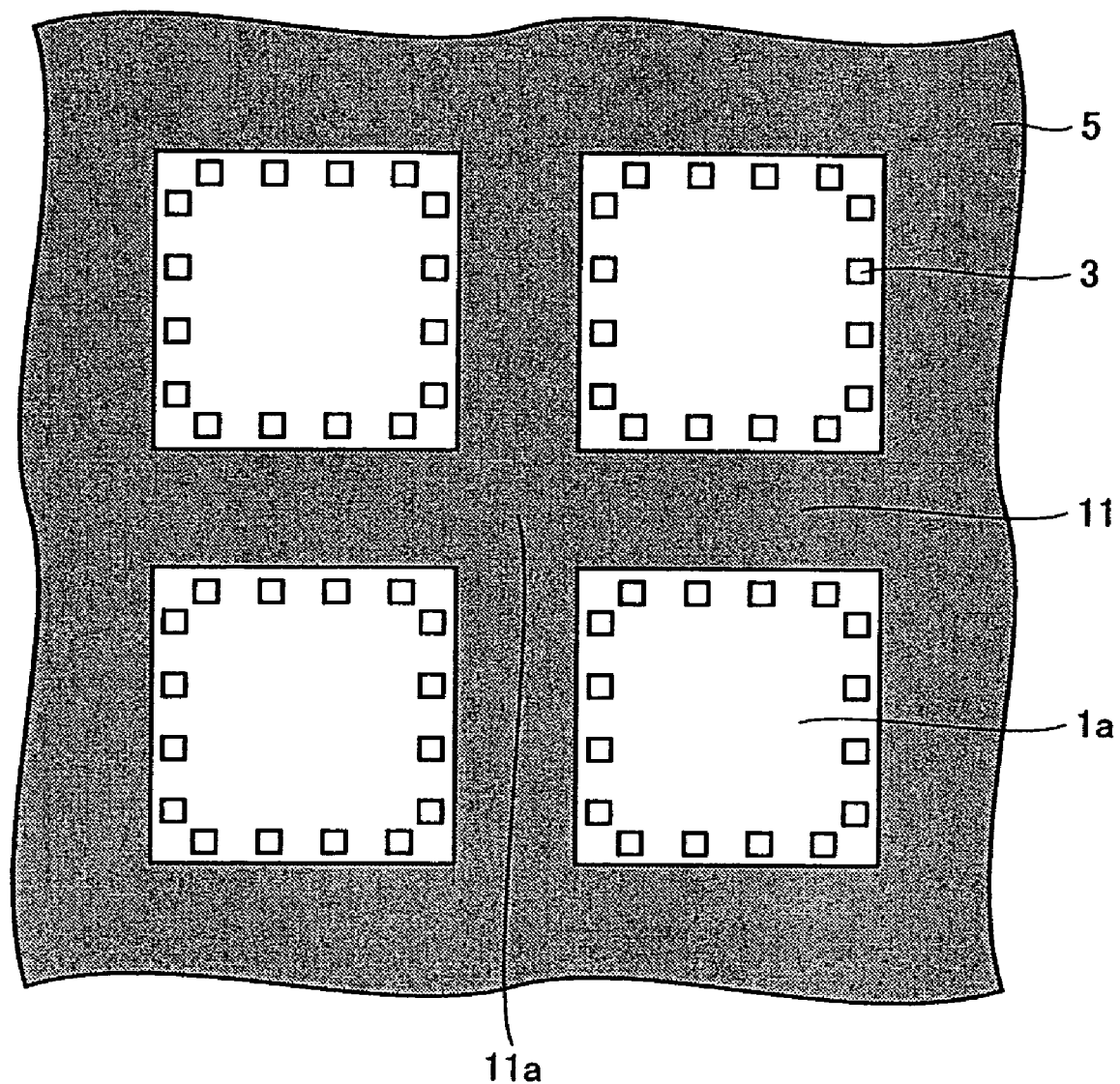
FIG. 17 is a plan view showing a stage after providing trenches between the circuit areas of the wafer shown in FIG. 16 by dicing.

FIG. 16 is a plan view showing a stage corresponding to the sectional view shown in FIG. 6. Circuit areas (semiconductor chips) 1a provided with circuits including electrodes 3 and having prescribed functions are formed on the wafer 1. The support plate 5 is bonded to the back surface of the wafer 1 by anodic oxidation. Thereafter trenches 11 are vertically and transversely formed to pass through the wafer 1 from the upper surface thereof, while defining an intersection 11a of the trenches 11 etc. The trenches 11 can be formed with a dicing saw.

Figure 18:
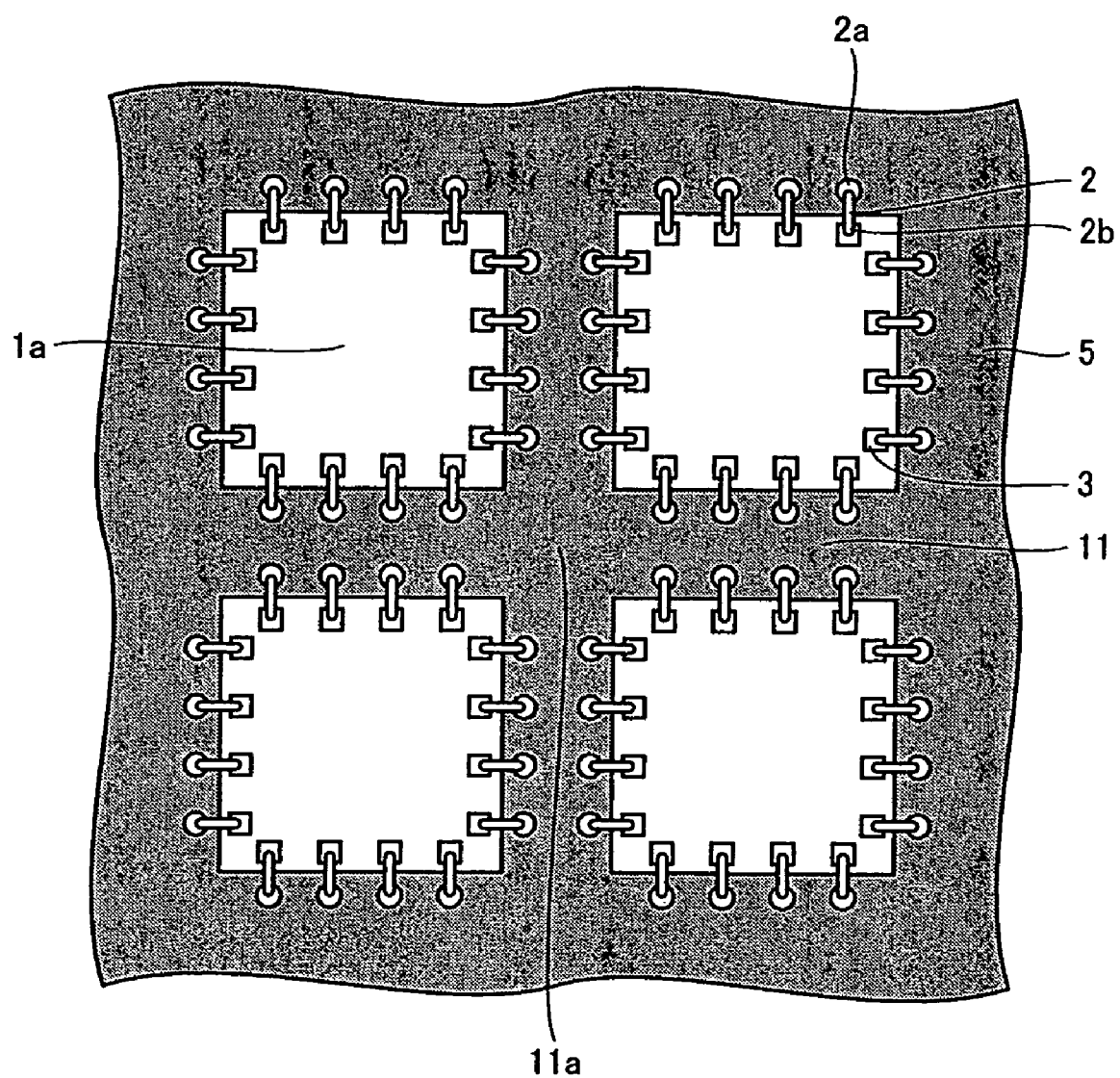
FIG. 18 is a plan view showing a stage after connecting electrodes of the semiconductor chips shown in FIG. 17 and the support plate with each other by wires.
Figure 19:
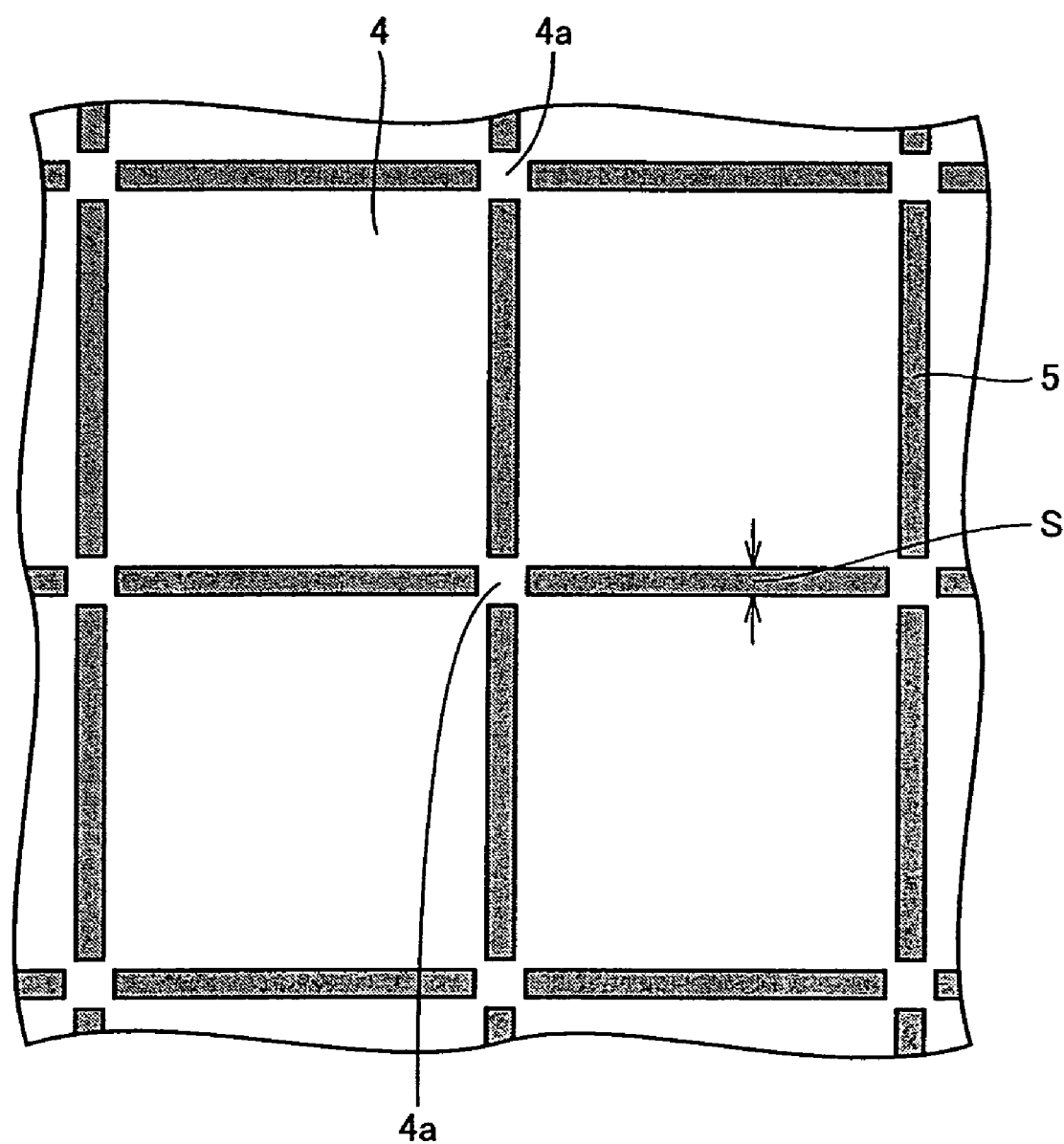
FIG. 19 is a sectional vie showing a stage after sealing the semiconductor chips and the wires shown in FIG. 18 with resin at intervals by arranging the resin on intersections between the trenches.

Then, the electrodes 3 and the support plate 5 are connected with each other by the wires 2, as shown in FIG. 18. At this time, the wire bonding conditions are adjusted to form the bulk connecting terminals 2a on the portions connected with the support plate 5. Then, portions excluding spaces S between the connecting terminals 2a of adjacent semiconductor devices are covered with resin 4, as shown in FIG. 19. Resin 4a is also arranged on positions corresponding to the intersections 11a of the trenches 11.

Figure 20:
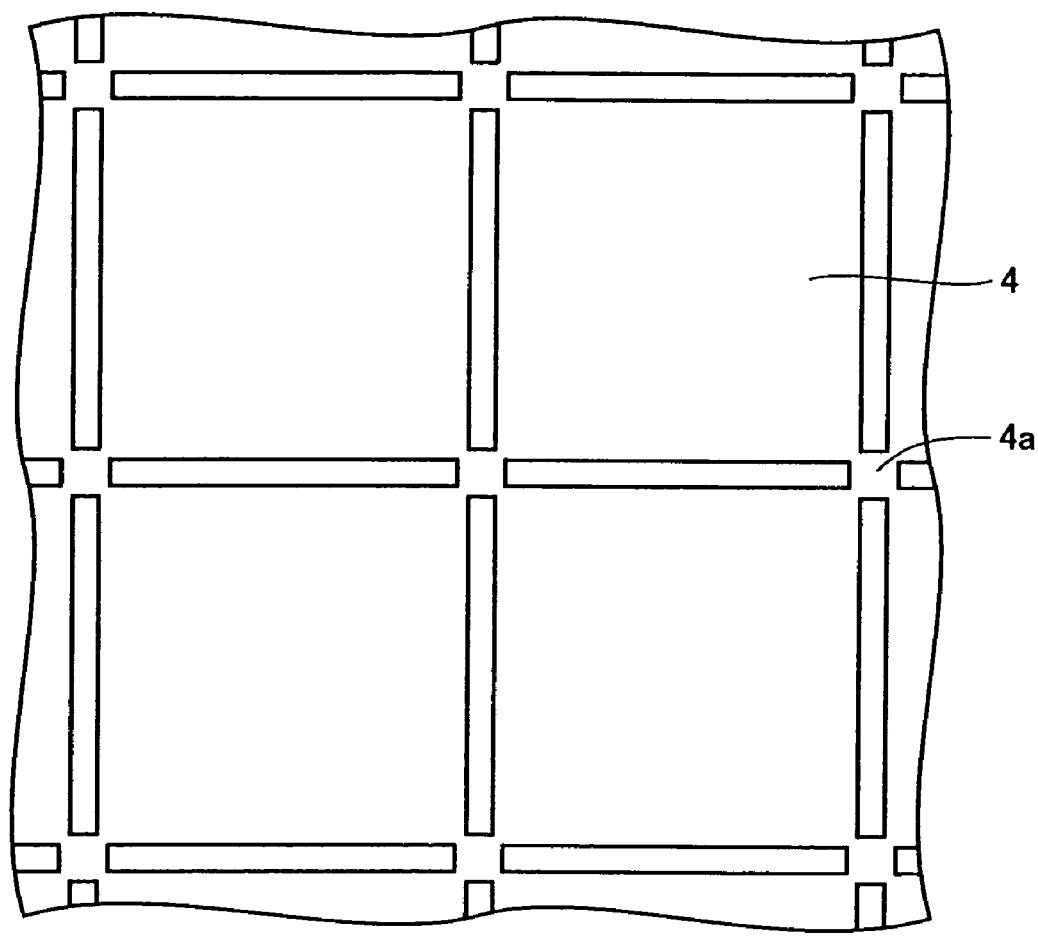
FIG. 20 is a sectional view showing a stage after removing the support plate shown in FIG. 19.
Figure 21:
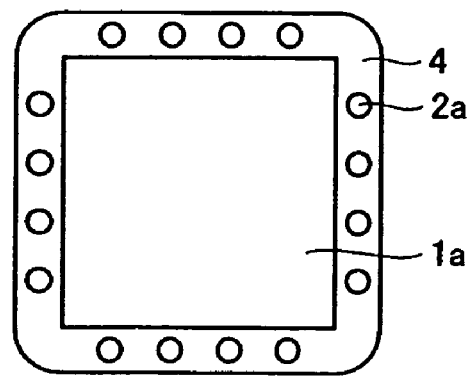
FIG. 21 is a plan view of a semiconductor device, fragmented from the state shown in FIG. 20, as viewed from the back side.

Then, the support plate 5 is removed, thereby obtaining semiconductor devices sealed with the resin 4 as shown in FIG. 20. The semiconductor devices are connected with each other by the resin 4a arranged on the intersections 11a of the trenches 11. FIG. 21 is a plan view showing each semiconductor device fragmented by removing the resin 4a as viewed from the back surface. The connecting terminals 2a formed from the wires 2 are arranged along edges of the semiconductor chip 1a.

According to the aforementioned fabrication method, a miniaturized semiconductor device having a simple structure can be obtained through extremely simplified fabrication steps. Therefore, a semiconductor device improved in degree of integration can be fabricated at a low cost.

(Sixth Embodiment)

Figure 22:
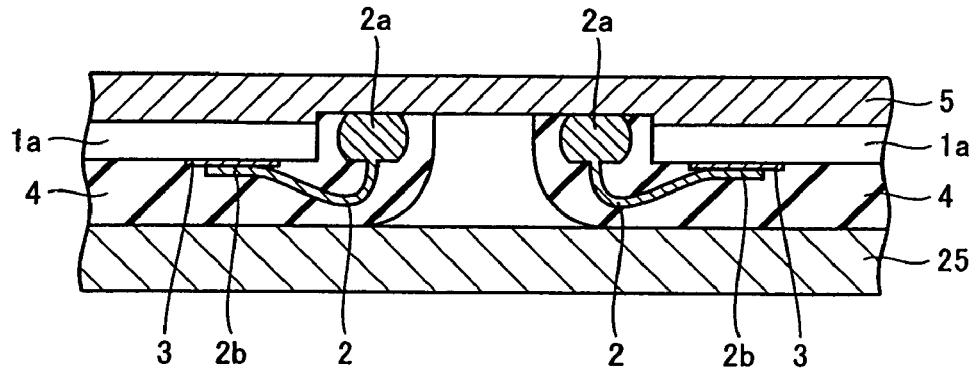
FIG. 22 is a sectional view showing a stage after arranging a support plate on the upper surfaces of semiconductor devices sealed with resin in a method of fabricating semiconductor devices according to a sixth embodiment of the present invention.
Figure 23:
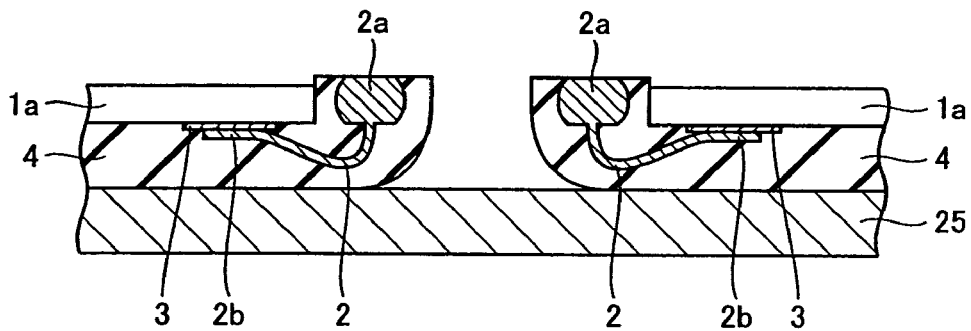
FIG. 23 is a sectional view showing a stage after removing the support plate shown in FIG. 22.
Figure 24:
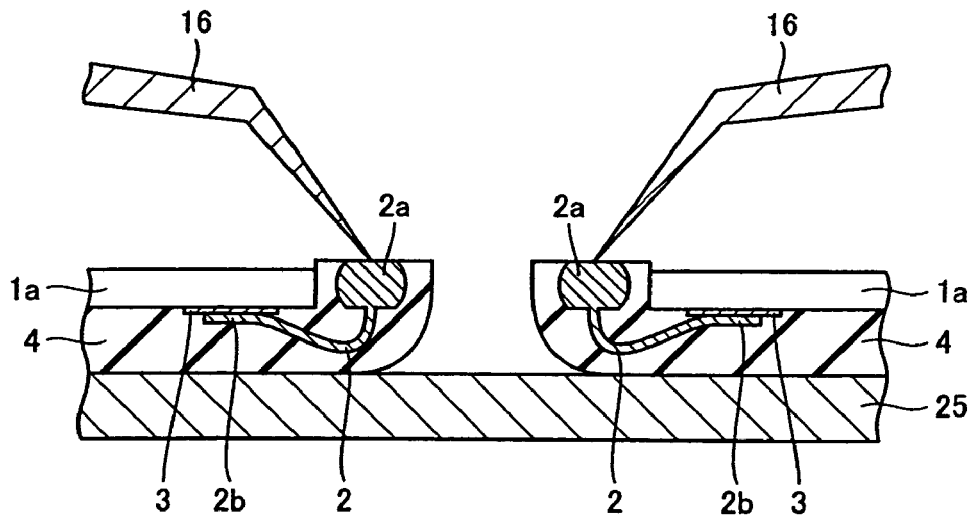
FIG. 24 is a sectional view showing a stage after applying probes to exposed connecting terminals shown in FIG. 23 for testing the electrical characteristics of the semiconductor devices.

FIGS. 22 to 24 illustrate a method of fabricating semiconductor devices according to a sixth embodiment of the present invention. The feature of this embodiment resides in the structure of the semiconductor device subjected to determination of effectiveness/defectiveness. After a support plate 5 and electrodes 3 of semiconductor chips 1a are connected with each other by wires 2 and sealed with resin 4 (see FIG. 10), an inspection support plate 25 is arranged on surfaces opposite to the support plate 5, as shown in FIG. 22. The second support plate 25 may be a film.

Then, the support plate 5 is removed by wet etching, as shown in FIG. 23. This wet etching may be replaced with mechanical polishing or CMP. Then, probes 16 are applied to exposed connecting terminals 2a for determining effectiveness/defectiveness of circuit functions of semiconductor devices, as shown in FIG. 24.

According to the aforementioned method, the respective semiconductor chips 1a can keep positions on a wafer also after the support plate 5 is removed. Therefore, the semiconductor chips 1a may not be individually transported for inspection but can be inspected in the state arranged on the wafer, similarly to the prior art. Thus, it is possible to efficiently inspect miniaturized semiconductor devices fabricated through extremely simplified fabrication steps with probes in a state integrally arranged similarly to the prior art.

(Seventh Embodiment)

Figure 25:
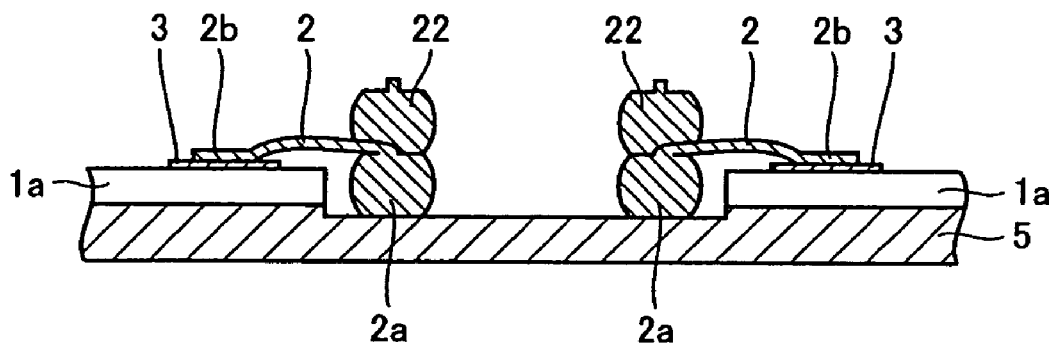
FIG. 25 is a sectional view showing a stage after forming connecting terminals, connecting the same by wires and thereafter forming upper connecting terminals on the connecting terminals in a method of fabricating semiconductor devices according to a seventh embodiment of the present invention.
Figure 26:
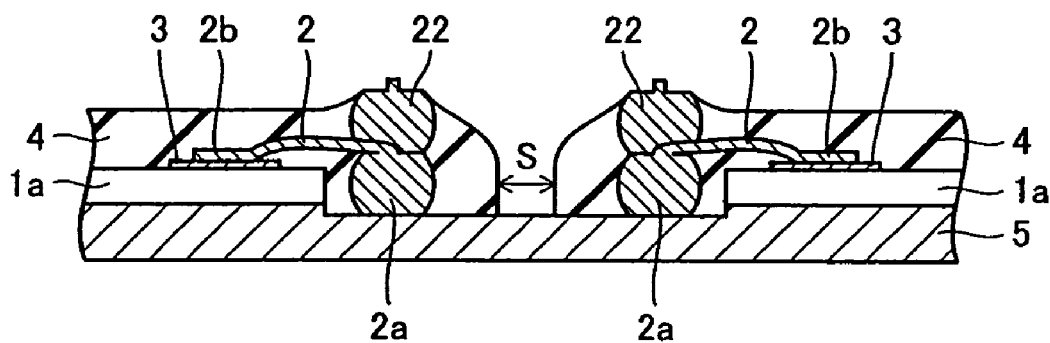
FIG. 26 is a sectional view showing a stage after forming resin patterns by screen printing to cover semiconductor chips, the wires and the connecting terminals shown in FIG. 25.

FIGS. 25 to 28 illustrate a method of fabricating semiconductor devices according to a seventh embodiment of the present invention. First, electrodes 3 of semiconductor chips 1a and a support plate 5 are connected with each other by wires 2 followed by formation of connecting terminals 2a on the support plate 5 (FIG. 8), and thereafter upper terminals 22 are formed in contact with the upper portions of the connecting terminals 2a, as shown in FIG. 25. The upper terminals 22 can be readily formed by wire bonding. Then, resin 4 is arranged on portions excluding a space S, for sealing the semiconductor chips 1a and the wires 2. Resin is arranged also on intersections of trenches, for connecting respective semiconductor devices with each other. The upper portions of the upper terminals 22 are exposed from the sealing resin 4.

Figure 27:
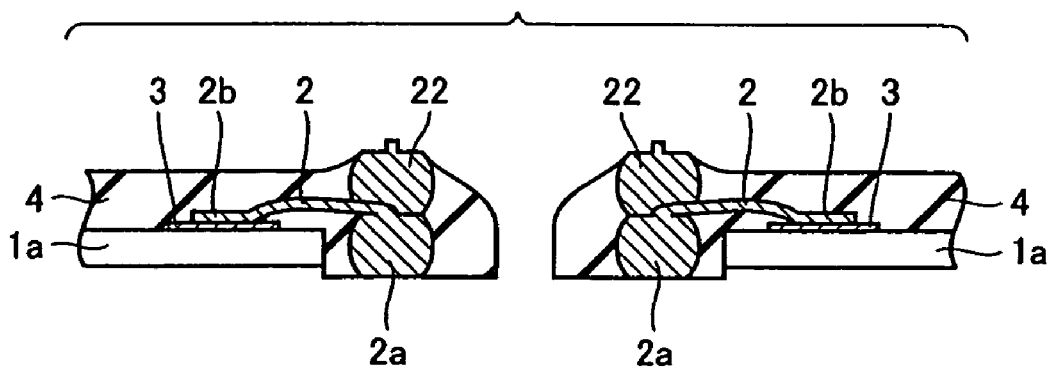
FIG. 27 is a sectional view showing a stage after removing a support plate shown in FIG. 26.
Figure 28:
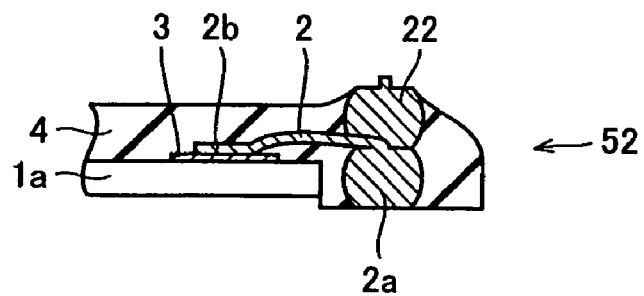
FIG. 28 illustrates a semiconductor device fragmented by removing resin from an intersection between trenches shown in FIG. 27.

Then, the support plate 5 is removed for obtaining semiconductor devices sealed with the resin 4, as shown in FIG. 27. Thereafter corner portions provided with the resin 4 are cut for obtaining each fragmented semiconductor device, as shown in FIG. 28.

Figure 29:
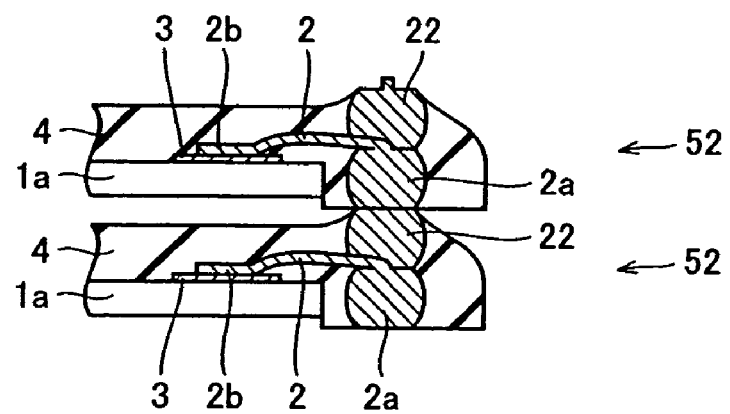
FIG. 29 is a sectional view showing a semiconductor device formed by successively stacking two semiconductor devices shown in FIG. 28.

This semiconductor device is a semiconductor device 52 provided with terminals on the same upper and lower positions. A miniaturized successively stacked semiconductor device, capable of high-density packaging, having a multilayer structure shown in FIG. 29 can be obtained by successively stacking such semiconductor devices 52 provided with terminals on the same upper and lower positions. When such a semiconductor device of the multilayer structure is employed, the density of integration can be remarkably improved as compared with the prior art.

(Eighth Embodiment)

Figure 30:
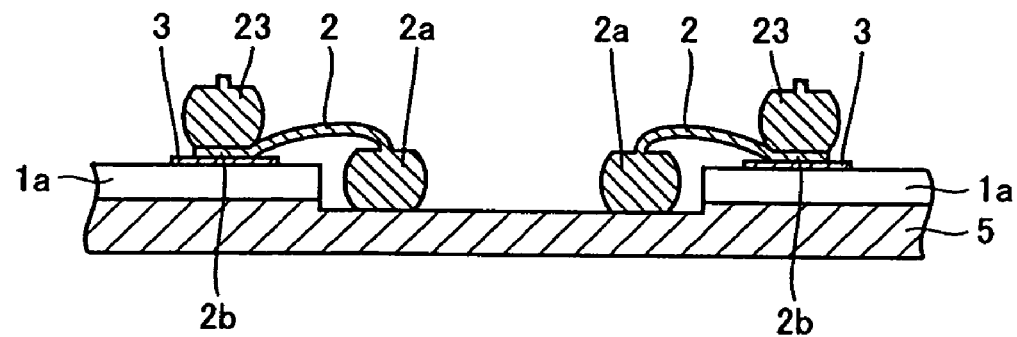
FIG. 30 is a sectional view showing a stage after forming connecting terminals, connecting the same by wires and thereafter forming upper connecting terminals on electrodes of semiconductor chips in a method of fabricating semiconductor devices according to an eighth embodiment of the present invention.
Figure 31:
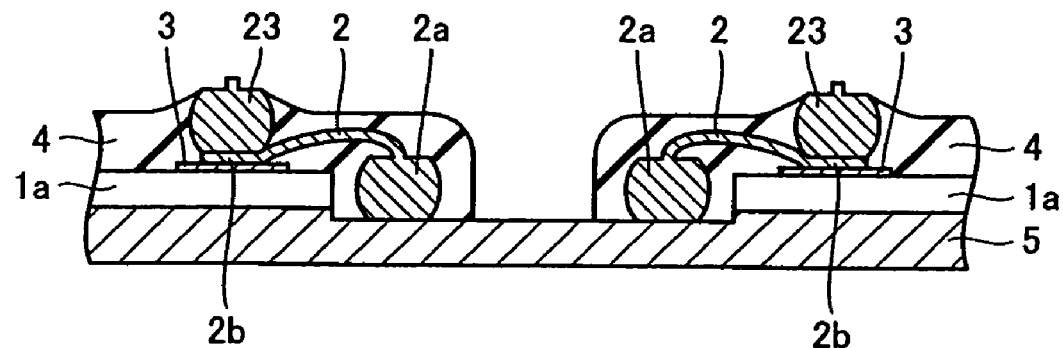
FIG. 31 is a sectional view showing a stage after forming resin patterns for exposing the upper connecting terminals from the upper surfaces when covering the semiconductor chips, the wires and the connecting terminals shown in FIG. 30 with resin.
Figure 32:
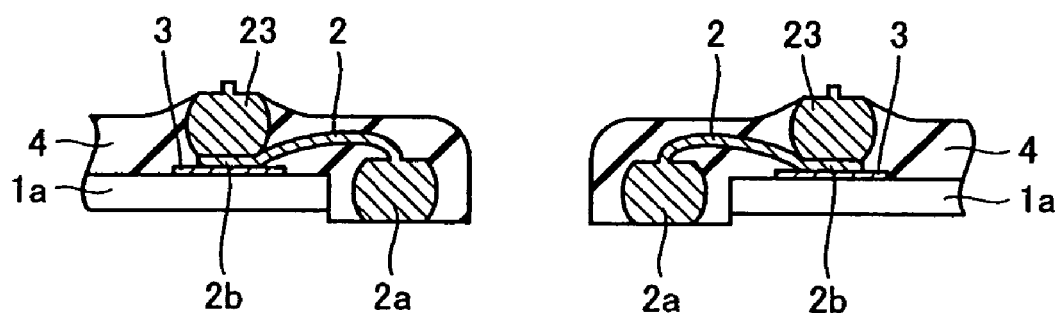
FIG. 32 is a sectional view showing a stage after removing a support plate shown in FIG. 31.

FIGS. 30 to 32 illustrate a method of fabricating semiconductor devices according to an eighth embodiment of the present invention. First, electrodes 3 of semiconductor chips 1a and a support plate 5 are connected with each other by wires 2 followed by formation of connecting terminals 2a on the support plate 5 (FIG. 8), and thereafter on-electrode terminals 23 are formed in contact with the upper portions of the electrodes 3, as shown in FIG. 30. The on-electrode terminals 23 can also be readily formed by wire bonding.

Then, resin 4 is arranged on portions including corner portions for sealing the semiconductor chips 1a and the wires 2 with the resin, as shown in FIG. 31. At this time, the upper surfaces of the aforementioned on-electrode terminals 23 are exposed from the resin 4. Then, the support plate 5 is removed for obtaining semiconductor devices sealed with the resin 4, as shown in FIG. 32. A fragmented semiconductor device can be obtained by removing the resin 4 from intersections of trenches (FIG. 33). This semiconductor device is provided on upper and lower portions with the connecting terminals 2a and 23, which are different in planar position from each other. Such a semiconductor device is referred to as a semiconductor device 53 provided with terminals on different upper and lower positions. This semiconductor device 53 has face-symmetrical arrangement as to a plane parallel to the main surface of the semiconductor chip 1a.

Figure 34:
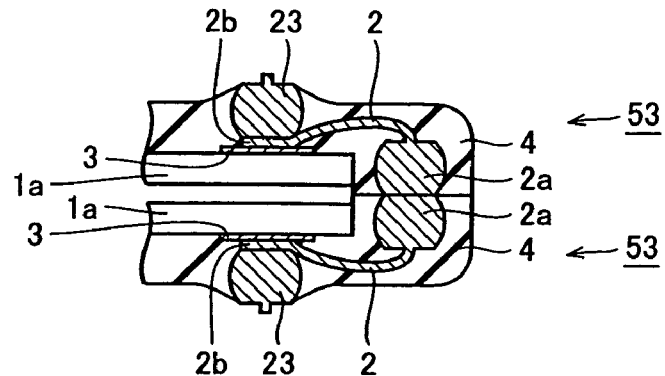
FIG. 34 is a sectional view of a semiconductor device having a two-layer structure formed by butt-jointing the bottom surfaces of the semiconductor device show in FIG.

FIG. 34 is a sectional block diagram showing a semiconductor device having a two-layer structure assembled by butting the bottom surfaces of two semiconductor devices 53 provided with terminals on different upper and lower positions against each other. In the case of face-symmetrical arrangement, it follows that the connecting terminals 2a are connected with each other when the bottom surfaces the semiconductor devices 53 are butted against each other. When the semiconductor device 53 provided with terminals on different upper and lower positions shown in FIG. 33 has no face symmetry, the semiconductor device having the two-layer structure shown in FIG. 34 cannot be obtained by employing two such semiconductor devices 53 provided with terminals on different upper and lower positions. When the semiconductor device 53 has no face symmetry, another semiconductor device having face symmetry with respect to the semiconductor device 53 shown in FIG. 33 must be prepared for butting the same against the semiconductor device 53 shown in FIG. 33 thereby attaining a two-layer structure. In the semiconductor device having a two-layer structure shown in FIG. 34, therefore, the semiconductor device 53 shown in FIG. 33 preferably has face symmetry.

FIG. 35 is a sectional block diagram showing a semiconductor device having a two-layer structure assembled by butting the upper surfaces of two semiconductor devices 53 provided with terminals on different upper and lower positions against each other. In the case of the aforementioned face symmetry, it follows that upper connecting terminals 23 are connected with each other when the upper surfaces of the semiconductor devices 53 are butted against each other. Also in the two-layer structure shown in FIG. 35, the semiconductor device 53 provided with terminals on different upper and lower positions shown in FIG. 33 must have face symmetry.

The semiconductor device of the two-layer structure shown in each of FIGS. 34 and 35, external connecting terminals are flush with each other in a planar view as a single integrated semiconductor device. Therefore, it is possible to fabricate a semiconductor device having an even layer structure of at least four layers by successively stacking such semiconductor devices having a two-layer structure. For example, FIG. 36 is a sectional block diagram showing a semiconductor device having a four-layer structure assembled by successively stacking two semiconductor devices having a two-layer structure shown in FIG. 35.

FIG. 37 is a sectional block diagram showing a semiconductor device having a three-layer structure as an exemplary semiconductor device having an odd layer structure. The semiconductor device shown in FIG. 37 can be viewed as a semiconductor device formed by (a) connecting the semiconductor device having a one-layer structure shown in FIG. 33 to the lower connecting terminal 23 of the semiconductor device having a two-layer structure shown in FIG. 34, or (b) connecting the semiconductor device having a one-layer structure shown in FIG. 33 to the upper connecting terminal 2a of the semiconductor device having a two-layer structure shown in FIG. 35.

When the connecting terminal 2a exposed on the upper surface is provided on the electrode 3 of the semiconductor chip 1a as described above, (A) an inverted multilayer semiconductor device having a multilayer structure can be obtained by connecting an inverted semiconductor device and the semiconductor device with each other if the semiconductor device has the aforementioned face symmetry. (B) If the semiconductor device has no face symmetry, an inverted multilayer semiconductor device having a multilayer structure can be obtained by preparing a face-symmetrical semiconductor device and connecting the face-symmetrical counter semiconductor device and the semiconductor device with each other in inverted arrangement.

The aforementioned semiconductor device, having an extremely simplified miniature structure, can be readily fabricated at a low cost.

(Ninth Embodiment)

FIGS. 38 and 39 illustrate a method of fabricating semiconductor devices according to a ninth embodiment of the present invention. According to this embodiment, resin 4 is molded in resin sealing so that side portions of connecting terminals 2a are exposed from the sealing resin 4 at the time of or after resin sealing (FIG. 38). In other words, resin patterns may be so set as to expose the side portions of the connecting terminals 2a, or set as shown in FIG. 10 illustrating the fifth embodiment so that the side portions of the connecting terminals 2a are partially polished with a dicing saw and exposed after resin sealing. Further alternatively, the overall surface of a wafer may be covered with resin 4 without employing resin patterns, for exposing the side portions of the connecting terminals 2a when cutting the wafer to separate the connecting terminals 2a of adjacent semiconductor devices from each other.

FIG. 39 is a plan view in the stage shown in FIG. 38. It is understood that the side portions of the connecting terminals 2a are exposed in this embodiment while the connecting terminals are covered with the resin 4 in the fifth embodiment as shown in FIG. 19. According to this structure, the bottom surfaces and the side portions of the connecting terminals 2a are exposed from the sealing resin 4 after a support plate 5 is removed, as shown in FIG. 40. FIG. 41 is a plan view showing a semiconductor device fragmented by segmenting corner potions covered with the resin 4 or the like as viewed from the back surface. As compared with the plan view shown in FIG. 21, it is understood that the side potions of the connecting terminals 2a are exposed.

FIG. 42 is a sectional view of the fragmented semiconductor device mounted on a circuit board 12. The connecting terminal 2a of the semiconductor device is connected to a connecting terminal 13 of the circuit board 12 through solder 7.

FIG. 43 is a sectional view showing a stage after fragmenting the semiconductor devices shown in FIG. 40 and mounting the fragmented semiconductor devices on wall circuit boards 32. The wall circuit boards 32 are provided with wired terminals 33, to which the side portions of the connecting terminals 2a are connected through solder 37. The wall circuit boards 32 can be arranged on four sides to enclose the peripheries of the semiconductor devices. The wall circuit boards 32 may not be arranged on some sides at need.

In each of the aforementioned semiconductor devices having a multilayer structure, the side portion of a single connecting terminal 2a is utilized for connection with each wall circuit board 32 without newly arranging a connecting terminal exposed on the upper portion of the semiconductor device. According to this embodiment, therefore, it is possible to obtain a miniaturized semiconductor device having a simple structure by an extremely simple fabrication method.

FIG. 44 is a sectional block diagram showing another semiconductor device according to the ninth embodiment of the present invention. When having at least one side provided with no wall circuit board, this semiconductor device having a multilayer structure comprises circuit boards 34 arranged to project outward from the side. In general, no connecting terminals are arranged on the aforementioned side. In the semiconductor device having a multilayer structure, wired connecting terminals 35 of the circuit boards 34 and the bottom surfaces of connecting terminals 2a are connected with each other through solder 37. The side portions of the connecting terminals 2a are employed for connecting terminals 33 to a terminal 33 of a wall circuit board 32.

According to this structure, it is possible to obtain a miniaturized multilayer semiconductor device having a simplified structure without further providing terminals for external connection. This structure is superior in heat radiation to the structure shown in FIG. 43, and can ensure highly reliable operations following high-density packaging. In combination with the structure of the semiconductor device shown in FIG. 43, various connection with an external circuit can be attained.

FIG. 45 is a sectional block diagram showing still another semiconductor device according to the ninth embodiment of the present invention. In this semiconductor device, heat slingers 39 are connected to plate members 6 provided on the back surfaces of semiconductor chips 1a without arranging circuit boards planarly placed in the semiconductor device shown in FIG. 44. In general, heat conductors are preferably arranged on the back surfaces of the semiconductor chips 1a in view of relaxation of working accuracy or the like, such heat conductors are not necessarily required but the back surfaces of the semiconductor chips 1a may be in contact with the heat slingers 39.

A high heat radiation effect can be attained according to this structure, whereby highly reliable operations can be ensured while ensuring extremely high packaging density.

(Tenth Embodiment)

According to a tenth embodiment of the present invention, the overall surface is covered with resin 4 as shown in FIG. 46 in resin sealing similar to that in the fifth embodiment (FIG. 10) without employing pattern formation means such as screen printing. In other words, electrodes 3 of semiconductor chips 1a and a support plate 5 are connected with each other by wires 2, and thereafter the semiconductor chips 1a and the wires 2 are filled up with the resin 4 along with a space between semiconductor devices. Thereafter an isolation trench having a width for exposing the side portions of connecting terminals 2a is formed with a dicing saw as shown in FIG. 47 before the support plate 5 is removed. At this time, the connecting terminals 2a may be partially cut. This isolation trench, formed on the boundary between the semiconductor devices for isolating the same from each other, has a depth reaching the support plate 5. Such isolation trenches are vertically and transversely formed to intersect with each other. Thereafter the support plate 5 is removed for fragmenting each semiconductor device as shown in FIG. 48. Thereafter a semiconductor device having a multilayer structure can be formed by employing wall circuit boards. Thus, a miniaturized semiconductor device having a simple structure can be obtained.

When the width of the trenches formed with the dicing saw is reduced in the aforementioned fabrication method, any of the semiconductor devices according to the first to fourth embodiments can be obtained.

When the aforementioned fabrication is employed, the aforementioned semiconductor device can be fabricated by a various fabrication method at a low cost without employing pattern formation method such as screen printing for resin sealing. When a conductive plate such as a metal plate is employed for the support plate 5, all electrodes are shorted in the stages shown in FIGS. 46 and 47. Therefore, it is possible to prevent electrostatic discharge damage possibly caused by cutting when forming trenches having a width for exposing the side portions of the electrodes.

(Eleventh Embodiment)

FIG. 49 illustrates semiconductor devices according to an eleventh embodiment of the present invention. Referring to FIG. 49 showing a state immediately after removing a support plate 5, the two semiconductor devices are opposed to each other. While the wire is formed by wire bonding in each of the first to tenth embodiments, the feature of this embodiment resides in that metal wires 18 formed by gas deposition connect electrodes 3 of semiconductor chips 1a and external connecting portions 18a with each other.

A fabrication method in the case of performing the aforementioned connection by gas deposition is now described. First, a wafer 1 is polished to a prescribed thickness, followed by formation of the electrodes 3 on prescribed portions of the surface of the wafer 1, as shown in FIG. 50. Thereafter the support pate 5 is bonded to the back surface of the semiconductor wafer 1 (FIG. 51). The support plate 5 can be formed by an aluminum plate. A trench 11 reaching the support plate 5 is provided in the wafer 1 by dicing, to separate the semiconductor wafer 1 into the semiconductor chips 1a (FIG. 52). Then, resist patterns 17 are formed to expose prescribed portions of the electrodes 3 and the trench 11 while covering the upper and side surfaces of the semiconductor chips 1a and the center of the trench 11 (FIG. 53).

Generally, the method may comprise a step of covering the first main surface of the semiconductor substrate with an insulator film (resist pattern) before the step of connecting the electrodes and the support plate with each other by the metal wire, and can form a metal film coming into contact with upper portions of the insulator film (resist pattern), the electrodes and the support plate by either gas deposition or plating in the step of connecting the electrodes and the support plate with each other by the metal wire.

This insulator film is formed not to cover the electrodes of the semiconductor chips, as a matter of course. This insulator film (resist pattern) may be removed after formation of the metal film by gas deposition or plating for newly forming another insulator film, or may be employed as the protective insulator film for the semiconductor chips as such. According to the aforementioned method, the connecting terminal can be readily brought into an arbitrary shape.

Thereafter the metal wires 18 are formed over the exposed portions of the electrodes 3 and the trench 11 by gas deposition (FIG. 54). First ends 18b of the metal wires 18 formed by gas deposition are connected to the electrodes 3 in a shape responsive to the shape of the electrodes 3. Second ends 18a of the metal wires 18 connected to external devices are in contact with the support plate 5 through flat contact potions, to define connecting terminals 18a having a shape preferable for connection. It is to be noted that the metal wires 18 are so formed that the connecting terminals 18a are different in shape from the remaining parts of the metal wires 18 also in the case of gas deposition, similarly to the case of wire bonding.

Thereafter the resist patterns 17 are removed, as shown in FIG. 55. Then, the semiconductor chips 1a are sealed with insulating resin 4 (FIG. 56). Thereafter the support plate 5 is removed for exposing the connecting terminals 18a of the metal wires 18, thereby obtaining the semiconductor devices shown in FIG. 49. While FIG. 49 shows the two semiconductor chips 1a holding the trench 11 therebetween, the number of such semiconductor chips 1a is not restricted to two but a large number of semiconductor chips 1a are separated from each other and formed in the stage after removing the aforementioned support plate 5, as a matter of course.

A structure of a semiconductor device fabricated by wire bonding can be fabricated by gas deposition. For example, FIG. 57 shows the structure of a semiconductor device having a thermal conductor arranged on the back surface of a semiconductor chip 1a for the purpose of heat radiation. Both of a metal wire 18 and a connecting terminal 18a are formed by gas deposition. FIG. 58 shows the structure of a semiconductor device having a metal wire 18, formed by gas deposition, including a connecting terminal 18a having a side surface exposed from sealing resin 4. Thus, the semiconductor device provided with the metal wire 18 including the connecting terminal 18a having the exposed side surface can also be formed by gas deposition.

As shown in each of the first to tenth embodiments, only a section of the wire forming the metal wire can be obtained when the metal wire is formed by wire bonding. Also as to the connecting terminal, only the bulk shape of the size obtainable by heating and deforming the wire in the wire bonding step can be obtained. When gas deposition is employed in place of the wire bonding as in this embodiment, however, the size of the connecting terminal 18a and the sectional area of the electric circuit of the metal wire 18 can be readily changed in response to the bonding strength and the current density.

When employing either gas deposition or plating, the connecting terminal may not be worked dissimilarly to the case of employing a wire. Both of the connecting terminal and the terminal part provided on the electrode can be formed into arbitrary shapes. When gas deposition or plating is employed, however, the metal wire, which cannot be extended in the air dissimilarly to a wire, is formed on a support layer covering at least the main surface of the semiconductor chip. A durable insulator film may be employed as this support layer, for defining a protective layer for the semiconductor chip as such. Alternatively, a resist film may be arranged as the support layer for forming the metal wire by the aforementioned gas deposition or plating and thereafter removed, for thereafter newly forming a durable insulator.

When the metal wire is formed by plating, electroplating is employed in general and hence a metal film for defining a cathode is formed on the aforementioned support layer.

(Twelfth Embodiment)

Referring to FIG. 59, two semiconductor devices according to a twelfth embodiment of the present invention are opposed to each other immediately after removing a support plate 5. The feature of this embodiment resides in that connecting terminals 18c of metal wires 18 formed by gas deposition are exposed from sealing resin 4 not only on bottom portions but also on upper portions.

The aforementioned semiconductor devices are fabricated identically to those of the eleventh embodiment up to a step similar to that shown in FIG. 53. In other words, the steps of fabricating the semiconductor devices according to the twelfth embodiment are identical to those of the eleventh embodiment up to a step of exposing prescribed portions of electrodes 3 and a trench 11 and forming resist patterns 17 to cover the upper and side surfaces of semiconductor chips 1a and the center of the trench 11 (see FIG. 53). Thereafter the metal wires 18 are formed by gas deposition. The connecting terminals 18c of the metal wires 18 are mounded to project upward (FIG. 60). The method of forming the metal wires 18 including the connecting terminals 18c is described later with reference to a thirteenth embodiment of the present invention.

Thereafter the resist patterns 17 are removed (FIG. 61), and the semiconductor chips 1a are sealed with the sealing resin 4 (FIG. 62). At this time, the upwardly projecting portions of the connecting terminals 18c are rendered to project from the sealing resin 4. Thereafter the support plate 5 is removed, thereby obtaining the fragmented semiconductor devices as shown in FIG. 59.

A forwardly layered semiconductor device can be obtained by forwardly stacking the semiconductor devices shown in FIG. 59, provided with terminals on the same upper and lower positions, as such. Alternatively, the upwardly projecting connecting terminals 18c can be provided on the positions of the electrodes 3.

FIG. 63 illustrates semiconductor devices having upwardly projecting connecting terminals 18d provided on the positions of electrodes 3. The semiconductor devices shown in FIG. 63 are provided with terminals on different upper and lower positions. A semiconductor device having a two-layer structure can be formed by combining such semiconductor devices provided with terminals on different upper and lower positions shown in FIG. 63 while butting the upper surfaces of the semiconductor devices against each other as shown in FIG. 35. The semiconductor device having such a two-layer structure is provided with terminals on different upper and lower positions when observed as a single semiconductor device. Therefore, a forwardly layered semiconductor device can be obtained by forwardly stacking an intended number of such semiconductor devices as such. In other words, an even number of the semiconductor devices shown in FIG. 63 are stacked.

When upwardly projecting connecting terminals are formed by gas deposition as described above, fabrication steps can be more simplified as compared with the case of forming two bulk terminals by wire bonding.

(Thirteenth Embodiment)

Referring to FIG. 64 showing a gas deposition apparatus employed for fabricating semiconductor devices according to the thirteenth embodiment of the present invention, a deposition source 56 consisting of raw material stored in a crucible 61 and heated and melted by a heater is arranged in a deposition source chamber 66. The deposition source chamber 66 is filled with helium, so that the raw material is vaporized into extremely fine particles, which in turn are guided to an evacuated sample chamber 64 through a transport tube 63. The fine particles are spouted from a nozzle 67 mounted on an end of the transport tube 63 closer to the sample chamber 64 and sprayed on a sample 55 arranged on an x-y-θ stage 65.

FIG. 65 shows a step of spouting the deposition source 56 from the nozzle 67 against the sample 55 for forming a metal wire 18. In order to form the metal wire 18 by gas deposition, the nozzle 67 and the sample 55 as well as the stage 65 may be relatively moved along parallel planes.

In order to form an upwardly projecting connecting terminal 18c, the deposition source 56 is spouted while stopping the nozzle 67 and the stage 65 as shown in FIG. 66. Consequently, the upwardly projecting connecting terminal 18c can be readily formed.

(Fourteenth Embodiment)

FIG. 67 shows two semiconductor devices according to a fourteenth embodiment of the present invention holding a trench 11 therebetween immediately after removal of a support plate 5. The feature of this embodiment resides in that insulator films 27 exposing electrodes 3 of semiconductor chips 1a while covering the remaining parts are left in the semiconductor devices when forming metal wires 18 by gas deposition. In each of the eleventh to thirteenth embodiments, the resist patterns 17 functioning similarly to the insulator films 27 are entirely removed, followed by sealing with the sealing resin 4.

The aforementioned semiconductor devices are fabricated similarly to those according to the eleventh embodiment up to a step similar to that shown in FIG. 52. In other words, the semiconductor devices according to the fourteenth embodiment are fabricated similarly to those according to the eleventh embodiment up to a stage of providing the trench 11 reaching the support plate 5 in a wafer by dicing to the separate semiconductor chips 1a from each other (see FIG. 52). Thereafter the semiconductor chips 1a are covered with insulating patterns 27 of polyimide, for example, while exposing the electrodes 3 and the center of the trench 11 along the width, as shown in FIG. 68. Then, the metal wires 18 are formed by gas deposition, to connect the electrodes 3 with portions of the support plate 5 located on the bottom of the trench 11. Thereafter the semiconductor chips 1a are sealed with sealing resin 4 while leaving the insulating patterns 27 intact. The fragmented semiconductor devices can be obtained by removing the support plate 5, as shown in FIG. 67.

According to this embodiment, the metal wires 18 are formed by gas deposition as shown in FIG. 69 after forming the patterns of the insulator films 27 such as polyimide films or silicon oxide films having excellent physical stability and chemical stability in place of the photoresist patterns 17. Thereafter the semiconductor chips 1a are sealed with the sealing resin 4, as shown in FIG. 70. According to this method, no step of removing resist patterns is required as compared with the method employing the photoresist patterns 17. Portions around the wires 18 are not hollowed before the semiconductor chips 1a are sealed with the resin 4, and hence the metal wires 18 are supported by polyimide or the like forming the insulating patterns 27. Therefore, the semiconductor devices can be stably produced with a high yield. Further, fine and precise connection is enabled due to the formation of the aforementioned insulating patterns 27.

(Fifteenth Embodiment)

FIG. 71 illustrates two semiconductor devices according to a fifteenth embodiment of the present invention holding a trench 11 therebetween immediately after removal of a support plate 5. The feature of this embodiment resides in that sealing resin films 28 exposing electrodes 3 of semiconductor chips 1a while covering the remaining parts are left in the semiconductor devices when forming metal wires 18 by gas deposition.

The aforementioned semiconductor devices are fabricated similarly to those according to the eleventh embodiment up to a step similar to that shown in FIG. 52. In other words, the semiconductor devices according to the fifteenth embodiment are fabricated similarly to those according to the eleventh embodiment up to a stage of providing the trench 11 reaching the support plate 5 in a wafer by dicing to separate the semiconductor chips 1a from each other (see FIG. 52). Thereafter the semiconductor chips 1a are covered with sealing resin patterns 28 by screen printing, for example, while exposing the electrodes 3 and the center of the trench 11 along the width, as shown in FIG. 72. Then, the metal wires 18 are formed by gas deposition, to connect the electrodes 3 with portions of the support plate 5 located on the bottom of the trench 11 (FIG. 73). Thereafter the fragmented semiconductor devices can be obtained by removing the support plate 5 while allowedly leaving the sealing resin patterns 28 intact, as shown in FIG. 71.

According to this embodiment, the sealing resin patterns 28 are employed in place of the photoresist patterns 17 or the insulator film patterns 27 of polyimide or the like. When the sealing resin patterns 28 are employed, the semiconductor devices can be fabricated through steps shorter than those employing the remaining patterns 17 or 27. At present, however, the sealing resin patterns 28 can be formed by only screen printing relatively inferior in dimensional accuracy. Therefore, the method according to the fifteenth embodiment cannot deal with refinement of the electrodes 3 at present. Further, only the metal wires 18 formed by gas deposition are located on the electrodes 3, and hence the semiconductor devices according to the fifteenth embodiment are inferior in reliability and durability to those according to the remaining embodiments.

(Sixteenth Embodiment)

Referring to FIG. 74 showing a sixteenth embodiment of the present invention, the upper surfaces of semiconductor devices identical to those shown in FIG. 71 are opposed to each other for forming a multilayer structure by connecting exposed metal wires with each other by solder 37. When a semiconductor device of this two-layer structure is observed as a single semiconductor device, connecting terminals are provided on the same upper and lower positions. Therefore, a multilayer semiconductor device having even layers can be readily obtained by successively stacking such semiconductor devices as such. The semiconductor device can also be improved in reliability and durability due to the solder 37 covering the metal wires.

(Seventeenth Embodiment)

FIG. 75 illustrates two semiconductor devices according to a seventeenth embodiment of the present invention holding a trench 11 therebetween immediately after removal of a support plate. The feature of this embodiment resides in that metal wires are formed by electroplating.

The aforementioned semiconductor devices are fabricated identically to those according to the fifteenth embodiment up to a step similar to that shown in FIG. 72. In other words, the semiconductor devices according to the seventeenth embodiment are fabricated similarly to those according to the fifteenth embodiment up to a stage of forming insulator film patterns 28 of polyimide, for example, while exposing electrodes 3 and the center of the trench 11 along the width (see FIG. 72). Then, a metal film 31 or the like defining cathodes for electroplating is formed by vapor deposition (FIG. 76). Then, resist patterns 17 are formed on portions other than those for forming the metal wires by electroplating and connecting the same (FIG. 77).

Thereafter portions of the metal film 31 not covered with the resist patterns 17 are employed as cathodes for forming connection patterns of the metal wires by electroplating (FIG. 78). Then, the resist patterns 17 are removed (FIG. 79). Further, connection patterns of metal films 38 formed by electroplating are employed as masks for removing the metal film 31 employed as the cathodes for electroplating by etching (FIG. 80). The fragmented semiconductor devices can be obtained by sealing semiconductor chips 1a with sealing resin 4 (FIG. 81) and removing the support plate 5, as shown in FIG. 75.

When the metal wires are formed by electroplating as described above, the number of fabrication steps is increased. However, finer working can be performed as compared with wire bonding or gas deposition due to employment of photolithography.

(Eighteenth Embodiment)

FIG. 82 illustrates two semiconductor devices according to an eighteenth embodiment of the present invention holding a trench therebetween immediately after removal of a support plate 5. The feature of this embodiment resides in that metal wires are formed by electroplating.

The aforementioned semiconductor devices are fabricated identically to those according to the seventeenth embodiment up to a step similar to that shown in FIG. 79. In other words, the semiconductor devices according to the eighteenth embodiment are fabricated similarly to those according to the seventeenth embodiment up to a stage of forming connection patterns of metal wires by electroplating while employing portions of a metal film 31 not covered with resist patterns 17 as cathodes and thereafter removing the resist patterns 17. Thereafter a second resist pattern 57 having openings above electrodes 3 of semiconductor chips 1a is formed as shown in FIG. 83. Then, on-electrode terminals 41 are formed in the openings by second electroplating (FIG. 84).

Thereafter the second resist pattern 57 is removed, as shown in FIG. 85. Then, the semiconductor chips 1a are sealed with sealing resin 4 while exposing the on-electrode terminals 41 (FIG. 86). The fragmented semiconductor devices can be obtained by thereafter removing the support plate 5, as shown in FIG. 82. The fragmented semiconductor devices shown in FIG. 82 are provided with terminals on different upper and lower positions.

FIG. 87 shows a modification of the semiconductor devices shown in FIG. 82. Referring to FIG. 87, upper connecting terminals 58 are formed on connecting terminals 38a formed on portions of a support plate located on the bottom of a trench. The semiconductor devices shown in FIG. 87 can be formed by providing a second resist pattern 57 to have openings above the connecting terminals 38a.

The semiconductor devices shown in each of FIGS. 82 and 87 can be basically formed by performing photolithography twice and electroplating twice. When forming multilayer connecting terminals by electroplating, not only superior fine working can be performed as compared with wire bonding or gas deposition but also the size of connecting terminals exposed on the upper surfaces can be readily controlled. Wire bonding is limited by the wire diameter, while the diameter of deposition material employed for forming connecting terminals by gas deposition is gradually reduced upward. In the gas deposition, therefore, the portions of the connecting terminals exposed on the upper surface of the sealing resin 4 are limited in size. According to electroplating, the connecting terminals 38a can be formed with no fluctuation in size by increasing the resolution of the resist pattern 57, regardless of the height of the on-electrode terminals 41.

(Nineteenth Embodiment)

FIGS. 88 to 93 illustrate a semiconductor device according to a nineteenth embodiment of the present invention and first to fifth modifications thereof respectively. According to this embodiment, a structure formable by wire bonding or gas deposition is formed by electroplating.

In the semiconductor device according to the nineteenth embodiment shown in FIG. 88, a metal wire is formed by electroplating by arranging a photoresist pattern in place of an insulator film pattern 17 consisting of polyimide, for example. The photoresist pattern is removed after etching and removing a part of a metal film 31 employed as a cathode through a mask of a metal wire 38 formed by electroplating before sealing a semiconductor chip 1a with sealing resin 4. The semiconductor chip 1a is sealed with the sealing resin 4 after removal of the photoresist pattern.

When arranging the same sealing resin 4 on the surface and the back surface of the metal wire 38 as described above, a possibility of disconnecting the metal wire 38 by stress resulting from thermal strain can be reduced.

In the semiconductor device according to the first modification of the nineteenth embodiment shown in FIG. 89, a connecting terminal 38a is partially exposed on the side surface of the semiconductor device. According to this structure, bonding strength can be improved similarly to the case of wire bonding or gas deposition.

The feature of the semiconductor device including a metal wire formed by electroplating according to the second modification of the nineteenth embodiment shown in FIG. 90 resides in that a step is provided between a semiconductor chip 1a and an insulator film pattern 27 of polyimide or the like on the back surface of the semiconductor device. The connecting terminal 38a projects due to the presence of such a step, thereby simplifying connection. Such simplification of connection attained by the projecting structure of the connecting terminal 38a is not restrictive but can be obtained in any method of forming the metal wire.

In the semiconductor device including a metal wire formed by electroplating according to the third modification of the nineteenth embodiment shown in FIG. 91, a plate 6 having excellent thermal conductivity is arranged on the back surface of a semiconductor chip 1a for the purpose of heat radiation. The heat radiation property of the semiconductor chip 1a can be improved due to the arrangement of the plate 6. Such improvement of the heat radiation property due to the arrangement of the aforementioned plate 6 is not restrictive either but can be obtained in any method of forming the metal wire.

The feature the semiconductor device including a metal wire 38 formed by electroplating according to the fourth modification of the nineteenth embodiment shown in FIG. 92 resides in that the upper, side and lower surfaces of an upper connecting terminal 58 provided on a connecting terminal 38a are exposed from sealing resin 4. When the upper connecting terminal 58 is exposed in the aforementioned manner, connection is enabled on a number of portions of the upper connecting terminal 58 so that the semiconductor device can be loaded on any circuit board. This function is not restrictive either but can be obtained in any method of forming the metal wire.

In the semiconductor device according to the fifth modification of the nineteenth embodiment shown in FIG. 93, an opening of a second resist pattern can be displaced outward beyond a first electroplating pattern in fabrication of a semiconductor device similar to that shown in FIG. 87. In the semiconductor device shown in FIG. 93, the side surface of an upper connecting terminal 58 is not entirely exposed, dissimilarly to the semiconductor device shown in FIG. 92. An upper portion of the side surface of the upper connecting terminal 58 is covered with sealing resin 4.

According to the semiconductor device shown in FIG. 93, a bonding agent such as solder can be prevented from creeping up toward the upper surface of the upper connecting terminal 58 while obtaining high bonding strength and excellent bondability on exposed portions of the side and lower surfaces of the upper connecting terminal 58.

(Twentieth Embodiment)

Referring to FIG. 94, the feature of a twentieth embodiment of the present invention resides in that positions of metal wires 2, 18 and 38 connecting electrodes of semiconductor chips and a support plate are displaced between adjacent semiconductor chips for alternately connecting the bottoms of trenches to the support plate. The trenches can be reduced in width due to the aforementioned arrangement of the metal wires 2, 18 and 38.

A method of fabricating semiconductor devices according to this embodiment can allowedly be carried out by any of wire bonding, gas deposition and plating. Particularly plating employing photolithography is so excellent in fine workability that the semiconductor devices can be fabricated without widening electrode pitches of semiconductor chips as compared with wire bonding and gas deposition. Wire bonding and gas deposition are relatively inferior in fine workability as compared with plating, and hence electrode pitches must be widened when trenches are reduced in width, relatively disadvantageously for semiconductor chips having numbers of electrodes.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a semiconductor chip having a main surface and electrodes on the main surface thereof;
   connection terminals;
   upper terminals;
   wires electrically connecting the connection terminals and the upper terminals with corresponding electrodes of the semiconductor chip;
   resin body having an upper surface and a bottom surface, sealing the main surface of the semiconductor chips and the wires; wherein
   the connection terminals are exposed on the bottom surface of the resin body, and the upper terminals are exposed on the upper surface of the resin body, wherein
   the connection terminals, the upper terminals and the wires are made of same material and the upper terminals are bonded on corresponding wires.

2. A semiconductor device comprising:
   a semiconductor chip having a main surface and electrodes on the main surface thereof;
   connection terminals;
   upper terminals;
   wires electrically connecting the connection terminals and the upper terminals with corresponding electrodes of the semiconductor chip;
   resin body having an upper surface and a bottom surface, sealing the main surface of the semiconductor chips and the wires; wherein
   the connection terminals are exposed on the bottom surface of the resin body, and the upper terminals are exposed on the upper surface of the resin body, wherein
   the connection terminals, the upper terminals and the wires are made of same material and the connection terminals, the upper terminals and the wires are made of bonding wires.

* * * * *